United States Patent
Lee

(10) Patent No.: US 10,223,072 B2
(45) Date of Patent: Mar. 5, 2019

(54) MODULO HARDWARE GENERATOR

(71) Applicant: Imagination Technologies Limited, Kings Langley (GB)

(72) Inventor: Samuel Lee, Cambridge (GB)

(73) Assignee: Imagination Technologies Limited, Kings Langley (GB)

( * ) Notice: Subject to any disclaimer, the term of this patent is extended or adjusted under 35 U.S.C. 154(b) by 56 days.

(21) Appl. No.: 15/363,360

(22) Filed: Nov. 29, 2016

(65) Prior Publication Data
US 2017/0153871 A1    Jun. 1, 2017

(30) Foreign Application Priority Data

Nov. 30, 2015    (GB) .................................... 1521113.9

(51) Int. Cl.
*G06F 7/535* (2006.01)
*G06F 17/50* (2006.01)

(52) U.S. Cl.
CPC .......... *G06F 7/535* (2013.01); *G06F 17/5045* (2013.01)

(58) Field of Classification Search
None
See application file for complete search history.

(56) References Cited

U.S. PATENT DOCUMENTS

| | | | | |
|---|---|---|---|---|
| 6,088,783 A | * | 7/2000 | Morton | G06F 9/3802 712/203 |
| 6,112,299 A | * | 8/2000 | Ebcioglu | G06F 9/30058 711/127 |
| 6,408,428 B1 | | 6/2002 | Schlansker et al. | |
| 6,892,293 B2 | * | 5/2005 | Sachs | G06F 9/3802 712/206 |
| 7,493,470 B1 | * | 2/2009 | Cumplido | G06F 7/5443 712/210 |
| 2013/0145328 A1 | | 6/2013 | Andraus et al. | |

OTHER PUBLICATIONS

Coussy P et al; "An Introduction to High-Level Synthesis"; IEEE Design & Test of Computers, IEEE Service Center; vol. 26, No. 4; Jul. 1, 2009; pp. 8-17; XP011444816.
J-P Deschamps et al; "Comparison of FPGA Implementation of the Mod M Reduction"; Latin American Applied Research 37; Dec. 31, 2007; pp. 93-97; XP55367922A.
Dinesh Varma Penumetcha et al; "FPGA Design Space Exploration of IDEA Cryptography IP Core"; Jan. 1, 2015; pp. 1-4; XP55367918A.

* cited by examiner

*Primary Examiner* — Michael D. Yaary
(74) *Attorney, Agent, or Firm* — Vorys, Sater, Seymour and Pease LLP; Vincent M DeLuca

(57) ABSTRACT

A method of generating a hardware design to calculate a modulo value for any input value in a target input range with respect to a constant value d using one or more range reduction stages. The hardware design is generated through an iterative process that selects the optimum component for mapping successively increasing input ranges to the target output range until a component is selected that maps the target input range to the target output range. Each iteration includes generating hardware design components for mapping the input range to the target output range using each of a plurality of modulo preserving range reduction methods, synthesizing the generated hardware design components, and selecting one of the generated hardware design components based on the results of the synthesis.

20 Claims, 14 Drawing Sheets

MODULO HARDWARE GENERATOR

BACKGROUND

As is known to those of skill in the art, a modulo operation, commonly written as a mod d, returns the remainder after the division of a first number (the dividend, a) by a second number (the divisor, d). The remainder may also be referred to as the modulo value.

There are several methods which can be used to implement a modulo operation in hardware logic (e.g. integrated circuit). Such hardware logic may form part of a processor such as a CPU (central processing unit) or GPU (graphics processing unit). One example method calculates the modulo value as a natural by-product of an iterative division implementation (e.g. an iterative division which calculates a/d). In particular, where the divisor, d, is a constant a divider can be optimized to only divide by the constant d and output the modulo value of a as the output.

Other example methods use other division methods, which don't produce a modulo value naturally, in combination with multiplication and subtraction to calculate the modulo value using the identity of equation (1):

$$a \bmod d = a - d * \left\lfloor \frac{a}{d} \right\rfloor \quad (1)$$

In other examples, where the divisor d is a multiple of a power of 2 (i.e. $d=2^k d_0$) the problem of determining the modulo value may be reduced to determining the modulo value of $d_0$ by outputting the least significant k bits of the input. This means that that only odd $d_0$ need to be considered. Therefore x [n−1:0] mod d can be broken down into x [n−1:k] mod $d_0$ concatenated with x [k−1:0]. For example x mod 6 (k=1) can be broken down as shown in equation (2) wherein "&" indicates a concatenation of bit strings.

$$x[n-1:0] \bmod 6 = (x[n-1:1] \bmod 3) \& x[0] \quad (2)$$

The embodiments described below are provided by way of example only and are not limiting of implementations which solve any or all of the disadvantages of known methods of generating a hardware design for implementing a modulo operation.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Described herein are methods and engines for generating a hardware design to calculate a modulo value for any input value in a target input range with respect to a constant value d using one or more range reduction stages. The hardware design is generated through an iterative process that identifies the optimum component for mapping successively increasing input ranges to the target output range until a component is identified that maps the target input range to the target output range. Each iteration involves generating at least one hardware design component for mapping the input range to the target output range for each of a plurality of range reduction methods, synthesizing the generated hardware design components, and selecting one of the generated hardware design components as the optimum component based on the results of the synthesis.

A first aspect provides a computer-implemented method of generating a hardware design to calculate a modulo value for any integer input value in a target input range with respect to a constant value d, the hardware design comprising one or more range reduction stages, the method comprising in a processing module: (a) generating at least one hardware design component to map a desired input range to a target output range using each of a plurality of modulo preserving range reduction methods; (b) synthesizing each of the hardware design components; (c) selecting one of the hardware design components as an optimum hardware design component for the desired input range based on the synthesis; and (d) expanding the desired input range and repeating (a) to (d) until an input range of the optimum hardware design component comprises the target input range.

A second aspect provides a modulo hardware generation engine to generate a hardware design to calculate a modulo value for any integer input value in a target input range with respect to a constant value d, the hardware design comprising one or more range reduction stages, the engine comprising: a plurality of range reduction modules, each range reduction module configured to generate a hardware design component to map an input range using one of a plurality of modulo preserving range reduction methods; a synthesis module configured to generate one or more synthesis metrics for a hardware design component, the one or more synthesis metrics providing an indication of a quality of a synthesized version of the hardware design component; decision logic in communication with the plurality of range reduction modules and the synthesis module, the decision logic configured to: (a) generate at least one hardware design component to map a desired input range to a target output range using each of the plurality of range reduction modules; (b) obtain one or more synthesis metrics for each of the hardware design components from the synthesis module; (c) select one of the hardware design components as an optimum hardware design component for the desired input range based on the synthesis metrics; and (d) expand the desired input range and repeat (a) to (d) until an input range of the optimum hardware design component comprises the target input range.

A third aspect provides computer readable code adapted to perform the steps of the method of the first aspect when the code is run on a computer.

A fourth aspect provides computer readable storage medium having encoded thereon the computer readable code of the third aspect.

A fifth aspect provides a hardware design to calculate a modulo value that was generated according to the method of any of the first aspect that, when processed in an integrated circuit manufacturing system, configures the integrated circuit manufacturing system to generate a manifestation of an integrated circuit to calculate the modulo value.

A sixth aspect provides a computer readable storage medium having stored thereon a hardware design to calculate a modulo value that was generated according to the method of the first aspect that, when processed in an integrated circuit manufacturing system, configures the integrated circuit manufacturing system to generate a manifestation of an integrated circuit to calculate the modulo value.

A seventh aspect provides an integrated circuit implementing a hardware design to calculate a modulo value that was generated according to the method of the first aspect.

The preferred features may be combined as appropriate, as would be apparent to a skilled person, and may be combined with any of the aspects of the invention.

BRIEF DESCRIPTION OF THE DRAWINGS

Embodiments of the invention will be described, by way of example, with reference to the following drawings, in which.

Figure 1:
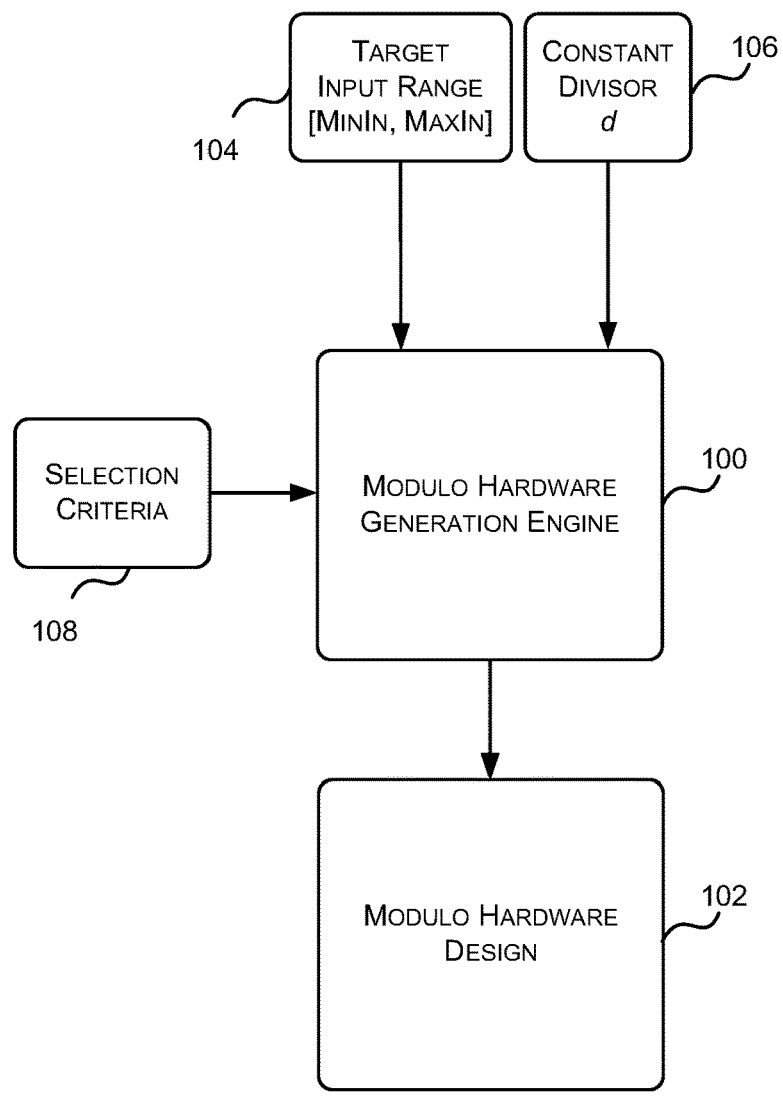
FIG. 1 is a block diagram of a modulo hardware generation engine for generating a hardware design to implement a modulo operation.

Common reference numerals are used throughout the figures to indicate similar features.

DETAILED DESCRIPTION

Embodiments of the present invention are described below by way of example only. These examples represent the best ways of putting the invention into practice that are currently known to the Applicant although they are not the only ways in which this could be achieved. The description sets forth the functions of the example and the sequence of steps for constructing and operating the example. However, the same or equivalent functions and sequences may be accomplished by different examples.

Other example methods generate a modulo value via one or more modulo preserving mappings. A mapping takes an input value in an input range [e, f] and maps it to a value in an output range [m, n]. A mapping in which the output range is smaller than the input range is referred to as a range reduction. Modulo preserving mappings are special mappings in which the input and output values will produce the same modulo value for a particular divisor. For example, if the input to a modulo preserving mapping is x and the output of the modulo preserving mapping is y for a particular divisor d then x mod d=y mod d.

In some examples a modulo value is generated through a sequence of modulo preserving mappings. For example a first stage may map the input x to a first intermediate output $y_1$ a second stage may map the first intermediate output $y_1$ to a second intermediate output $y_2$ and so on until the input is mapped to the output range [0, d−1]. The relationship between the input, intermediate outputs and final output is expressed in equation (3):

$$x \bmod d = y_1 \bmod d = y_2 \bmod d = \ldots = y_f \bmod d = y_f \qquad (3)$$

There are a number of different methods for implementing modulo preserving range reductions, which are referred to herein as modulo preserving range reduction methods, or simply range reduction methods. For example, in some cases an input value may be mapped to an output value by adding or subtracting a multiple of the divisor, d, or applying a transform such as that shown in equation (4) where x is the input value and $x_i$ is the $i^{th}$ bit of the input value x:

$$x = \Sigma_i 2^i x_i \rightarrow y = \Sigma_i (2^i \bmod d) x_i \qquad (4)$$

While there are multiple different range reduction methods many tools for generating hardware designs to implement a modulo operation through one or more range reduction stages are typically constrained to use only one particular range reduction method for each range reduction stage. While more sophisticated tools may allow for different range reduction methods to be used for different range reduction stages the selection of the range reduction method for a particular range reduction stage is typically made based on static numerical metrics, not based on actual hardware metrics.

Accordingly, described herein are methods and engines for generating a hardware design to implement a modulo operation (defined by a target input range [MinIn, MaxIn] and a target output range [MinOut, MaxOut]=[0, d−1] where d is the constant divisor) through one or more range reduction stages by iteratively selecting the best hardware design component to map larger and larger input ranges to the target output range until a hardware design component has been selected that maps the target input range to the target output range. Each iteration involves generating at least one hardware design component that maps a particular input range to the target output range for each of a plurality of range reduction methods, each hardware design component comprising a first range reduction stage that uses the corresponding range reduction method; synthesizing the generated hardware components; and selecting one of the generated hardware design components as the optimum component to map the particular input range to the target output range based on the synthesis.

The hardware design to implement the modulo operation comprises a plurality of sequential modulo preserving range reduction stages, each stage implements a modulo preserving mapping using one of a plurality of range reduction methods. Different stages may use different range reduction methods. The stages are connected in series so that the output of an earlier stage becomes the input to a later stage. Each successive stage has a smaller input range than the previous stage. If stage A feeds into stage B then stage A is said to be upstream of stage B, and similarly stage B is said to be downstream of stage A.

In some examples the modulo operation hardware design is generated from back to front. In particular in the first iteration an optimal hardware design component for mapping a small input range to the target output range is selected by generating potential components using a plurality of range reduction methods, synthesizing the generated components, and selecting one of the generated components as the optimum component based on the results of the synthesis (e.g. the one with the lowest area or best speed). In the next iteration an optimal hardware design component for mapping a larger input range than in the previous iteration to the target range is then identified in a similar manner—i.e. by generating components that maps the larger input range to the target output range using a plurality of range reduction methods, synthesizing the generated components, and selecting one of the generated components based on the results of the synthesis. The method continues until an optimum hardware component that maps the entire input range to the target output range has been selected.

Selecting the optimum component to map successively larger input ranges instead of selecting optimum components to map successively smaller input ranges may increase the speed and/or efficiency at which a hardware design to implement the modulo operation can be produced. In particular by working backwards the number of different possible components to be evaluated may be significantly reduced. For example, if g is the number of range reduction methods and h is the number of range reduction stages, approaching the problem from the target input range results in a problem of size $g^h$, whereas approaching the problem from the target output range results in a problem of size gh. Testing has shown that where traditional methods may take more than a year to produce a hardware design for a particular input and output range combination with a particular set of range reduction methods, a hardware design for the same input and output range combination and set of range reduction methods may be produced using the methods described herein within a day.

Reference is first made to FIG. 1 which illustrates an example of a modulo hardware generation engine 100 for generating a hardware design 102 to implement a modulo operation (which is also referred to herein as a modulo hardware design).

The modulo hardware generation engine 100 receives as inputs the target input range 104 and constant divisor (or constant value) d 106 for the modulo operation. The target input range may be explicitly defined by a minimum input number, MinIn, and a maximum input number, MaxIn; or it may be defined by number of bits n of the input. In particular, for an unsigned input of n bits the target input range may be determined to be $[0, 2^n-1]$. The target output range is defined by the divisor d to be $[0, d-1]$.

The modulo hardware generation engine 100 generates a hardware design to implement a modulo operation for the received input range and divisor that comprises one or more modulo preserving range reduction stages. As described above, each range reduction stage maps an input range to an output range using one of a plurality of range reduction methods. The hardware design is generated through an iterative process that selects the optimum component for mapping successively increasing input ranges to the target output range until a component is selected that maps the target input range to the target output range. Each iteration comprises generating at least one hardware component to map the input range to the target output range for each of a plurality of range reduction methods, each component has a first range reduction stage that uses the corresponding range reduction method to map the input range; synthesizing the generated components; and selecting one of the generated components as the optimum component based on the results of the synthesis.

The results of the synthesis may be an indication of the QoR (quality of results) of the synthesized components. For example, the results of the synthesis may be in the form of one or more synthesis metrics such as, but not limited to, delay time (i.e. time to produce a result), area and power usage. The modulo hardware generation engine 100 then uses the results of the synthesis (e.g. synthesis metrics) to select the best or optimum component for the particular input range.

In some cases the modulo hardware generation engine 100 receives as an input one or more selection criterion 108 which provides information on how to select the best or optimum component from the results of the synthesis (e.g. synthesis metrics). In some cases the selection criteria may indicate which synthesis metric is paramount. For example, the selection criteria may specify that delay time is paramount causing the component with the shortest delay to be selected as the optimum component. In other examples, the selection criteria may specify that area is paramount causing the component with the smallest area to be selected as the optimum component.

In other cases the selection criteria may specify a certain relationship between synthesis metrics that is used to select the optimum component. For example, the selection criteria may assign a weight to the synthesis metrics that indicates their relative importance. In other examples, the selection criteria may specify a combination of the synthesis metrics to achieve a certain objective. For example, if the synthesis metrics include an area A and a delay D then the selection criteria may indicate that the component with the lowest (A+100D) is to be selected to target a specific area to delay ratio.

It will be evident to a person of skill in the art that these are examples only and the selection criteria may specify more or less complex selection functions based on the synthesis metrics. For example, the selection criteria may specify that area is the most important synthesis metric, but if the area does not definitively indicate one component is better than the other (e.g. the area metric is noisy), delay may be used as the secondary metric. Such a selection function may be represented by the following logic where $A_1$ is the area of component 1, $D_1$ is the delay of component 1, $A_2$ is the area of component 2, and $D_2$ is the delay of component 2:

```
if (|A₁ - A₂| > Area tolerance) {
    if (A₁ < A₂) { Choose component 1 } else {Choose component 2}
} else {
    if (D₁ < D₂) { Choose component 1 } else {Choose component 2}
}
```

The term "hardware design" is used herein to refer to a description of an integrated circuit for all or part of an electronic system (e.g. a processor) which can be used to generate a hardware manifestation of the integrated circuit (e.g. the hardware design may be synthesized into silicon or used to program a field-programmable gate array (FPGA)). The hardware design may relate to a module, block, unit, sub-system, system or any combination thereof of the electronic system (e.g. processor).

A hardware design may be implemented in a high level hardware description language (HDL), such as, but not limited to, a register transfer language (RTL). Examples of register transfer languages include, but are not limited to, VHDL (VHS IC Hardware Description Language) and Verilog. It will be evident to a person of skill in the art that other high level languages may be used such as proprietary high level languages.

Figure 2:
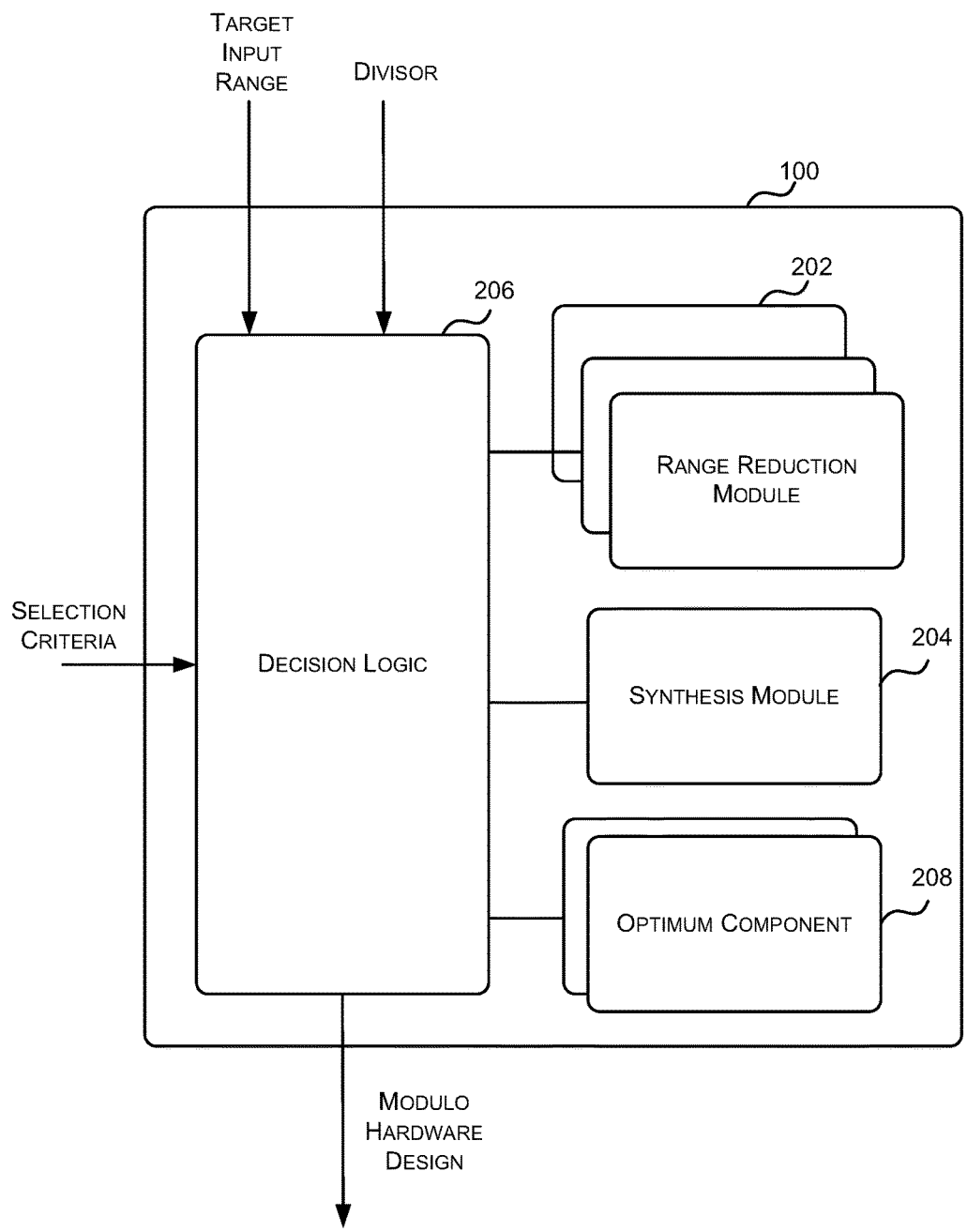
FIG. 2 is a block diagram of an example implementation of the modulo hardware generation engine of FIG. 1.

Reference is now made to FIG. 2 which illustrates a block diagram of an example implementation of the modulo hardware generation engine 100 of FIG. 1. The modulo hardware generation engine 100 comprises a plurality of modulo preserving range reduction modules 202 for generating hardware design components to map a specific input range to a specific output range in accordance with one of a plurality of range reduction methods; a synthesis module 204 for synthesizing one or more of the components and generating synthesis metrics; decision logic 206 for generating a hardware design to implement a modulo operation for the received target input range and divisor that comprises one or more range reduction stages using the range reduction modules 202 and the synthesis module 204; and optimum hardware design components 208 identified each iteration.

Each modulo preserving range reduction module 202 is a software module that receives an input range and a divisor and generates a hardware design component, which may be referred to herein simply as a "component", that maps the input range to a smaller output range while preserving the modulo value of the input using one of a plurality of modulo preserving range reduction methods. Each component may be implemented in a high level hardware description language (HDL), such as, but not limited to, a register transfer language (RTL). Examples of register transfer languages include, but are not limited to, VHDL (VHSIC Hardware Description Language) and Verilog. It will be evident to a person of skill in the art that other high level languages may be used such as proprietary high level languages.

Example modulo preserving range reduction methods which may be used by the range reduction modules 202 include, but are not limited to a subtraction method; a greedy modulo method; a paired greedy modulo method; an unsigned multiples method; a paired unsigned multiples method; a greedy signed method; and a paired greedy signed method.

A subtraction method maps unsigned input ranges to unsigned output ranges by subtracting a multiple k of the divisor d from the input x. For example, a subtraction method may map an input value x to an output value in accordance with the following:

if $((x-kd)<0)\{$return $x\}$ else $\{$return $x-kd\}$

The multiple k may be selected using a predetermined heuristic. For example, given an input range [0, M] the multiple k may be selected in accordance with the following:

if $\left(\left\lfloor\frac{M}{d}\right\rfloor<16\right)\left\{\text{try all } k \in \left\{2^i : i \in \left[0, \log_2\left\lfloor\frac{M}{d}\right\rfloor\right]\right\}\right\}$ else $\{$try $k = 2^{\lfloor\log_2\lfloor\frac{M}{d}\rfloor\rfloor}\}$ This is based on the premise that a subtraction method is most effective for a small input range so in these cases it is worth trying various values of k. If, however, the input range is large then only a single value of k is tried, which attempts to halve the input range.

A greedy modulo method maps signed and unsigned input ranges to unsigned output ranges by converting the input into a sum of powers of 2 and generating an output that is the sum of modulo values for each power of 2. For example a greedy modulo method may map an input x, where $x_i$ is the $i^{th}$ bit of the input, to an output y according to the following:

$$x = \sum_i 2^i x_i \rightarrow y = \sum_i (2^i \bmod d) x_i$$

Such a method may be described as being "greedy" because the mapping of $x_i \rightarrow 2^i$ mod d is the most reduction that is possible on $x_i$ in isolation. However, such a method does not take into account the fact that $2^i$ mod d may have a large Hamming weight which can be costly to implement in hardware.

A paired greedy modulo method maps signed and unsigned input ranges to unsigned output ranges and is based on the same premise as the greedy modulo method but also checks through the values of ($2^i$ mod d) for pairs (i,j) such that ($2^i$ mod d)+($2^j$ mod d)≥d to map an input x to an output y as follows:

$$x = \sum_i 2^i x_i \rightarrow y =$$

$$\sum_{k \notin Pairs} (2^k \bmod d) x_k + \sum_{(i,j) \in Pairs} ((2^i \bmod d) x_i + (2^j \bmod d) x_j - (x_i \wedge x_j) d)$$

An unsigned multiple method maps signed and unsigned input ranges to unsigned output ranges and is based on the same premise as the greedy modulo method, but in an unsigned multiple method the values of ($2^i$ mod d) are assessed to determine if adding a multiple of the divisor d will reduce the Hamming weight. Based on the assessment several different implementations are tried, which may be of the form:

$$x = \sum_i 2^i x_i \rightarrow y = \sum_i (k_i d + 2^i \bmod d) x_i$$

This method has a tradeoff between the cost of reducing the range versus the amount the range is reduced. Preferably as many multiples of the divisor d are added as possible without making the output range larger than the target output range.

A paired unsigned multiples method maps signed and unsigned input ranges to unsigned output ranges by implementing the pairing described above with respect to the paired greedy modulo method and the adding of multiples of d described above with respect to the greedy signed method.

A greedy signed method maps signed and unsigned input ranges to signed output ranges by converting the input into a sum of powers of 2 and generating an output that is the sum of modulo valued for each power of 2 which preserves a mapping to the range $$\left[ -\left\lfloor \frac{d-1}{2} \right\rfloor, \left\lfloor \frac{d}{2} \right\rfloor \right].$$

For example if x mod$_s$ d is the modulo preserving mapping to the range $$x = \sum_i 2^i x_i \to y = \sum_i (2^i \bmod_s d) x_i$$

then a greedy signed method may map an input x to an output y according to the following:

$$\left[ -\left\lfloor \frac{d-1}{2} \right\rfloor, \left\lfloor \frac{d}{2} \right\rfloor \right]$$

A paired greedy signed method maps signed and unsigned input ranges to signed output ranges by implementing the pairing described above with respect to the paired greedy modulo method in combination with the greedy signed method.

In the examples described herein the modulo hardware generation engine 100 comprises three modulo preserving range reduction modules 202, but it will be evident to a person of skill in the art that only two range reduction modules 202 may be used, or more than three range reduction modules 202 may be used.

The synthesis module 204 is a software module that is configured to generate synthesized versions of the hardware design components and to provide synthesis metrics to the decision logic 206 for each synthesized component. As is known to those of skill in the art, synthesizing a hardware design that is implemented in a hardware description language (HDL), such as VHDL, involves transforming the abstract form of the desired circuit behavior described by the HDL into a hardware implementation in terms of logic gates.

The synthesis metrics provide an indication of the quality of the synthesized component (which may be referred to herein as a synthesized version of the hardware design component). For example, the synthesis metrics may provide information on the delay to produce a modulo value, the area of the synthesized component, and/or the power usage. It will be evident to a person of skill in the art that these are examples only and that the synthesis metrics may convey other information that describes or provides an indication of the QoR of the synthesized component.

The decision logic 206 is a software component configured to generate a hardware design to implement a modulo operation, for the target input range and the divisor, that comprises one or more range reduction stages wherein the component (and thus range reduction method) used to implement a particular stage is based on the synthesis metrics received from the synthesis tool 204 for components for implementing the stage using the various range reduction methods. In particular the decision logic 206 is configured to iteratively select components for mapping successively increasing input ranges to the output range, where each iteration involves generating components that map the input range to the target output range using each of the modulo preserving reduction modules 202, synthesizing the generated components using the synthesis module 204, and selecting one of the generated components as the optimal component for mapping that input range to the target output range based on the synthesis metrics generated by the synthesis module 204 and/or the selection criteria.

The decision logic 206 starts by selecting a component that maps a small input range to the target output range. Components that map successively larger input ranges to the target range are selected in a similar manner until a component that maps the entire target input range to the target output range is selected. The input ranges for subsequent iterations are selected based on the input range of the optimum component selected in the previous iteration.

An example method for generating a hardware design to implement a modulo operation for a target input range and a divisor which may be implemented by the decision logic 206 is described with reference to FIG. 3.

The optimum component selected by the decision logic 206 in each iteration may be stored as an optimum component 208 for use in later iterations.

Figure 3:
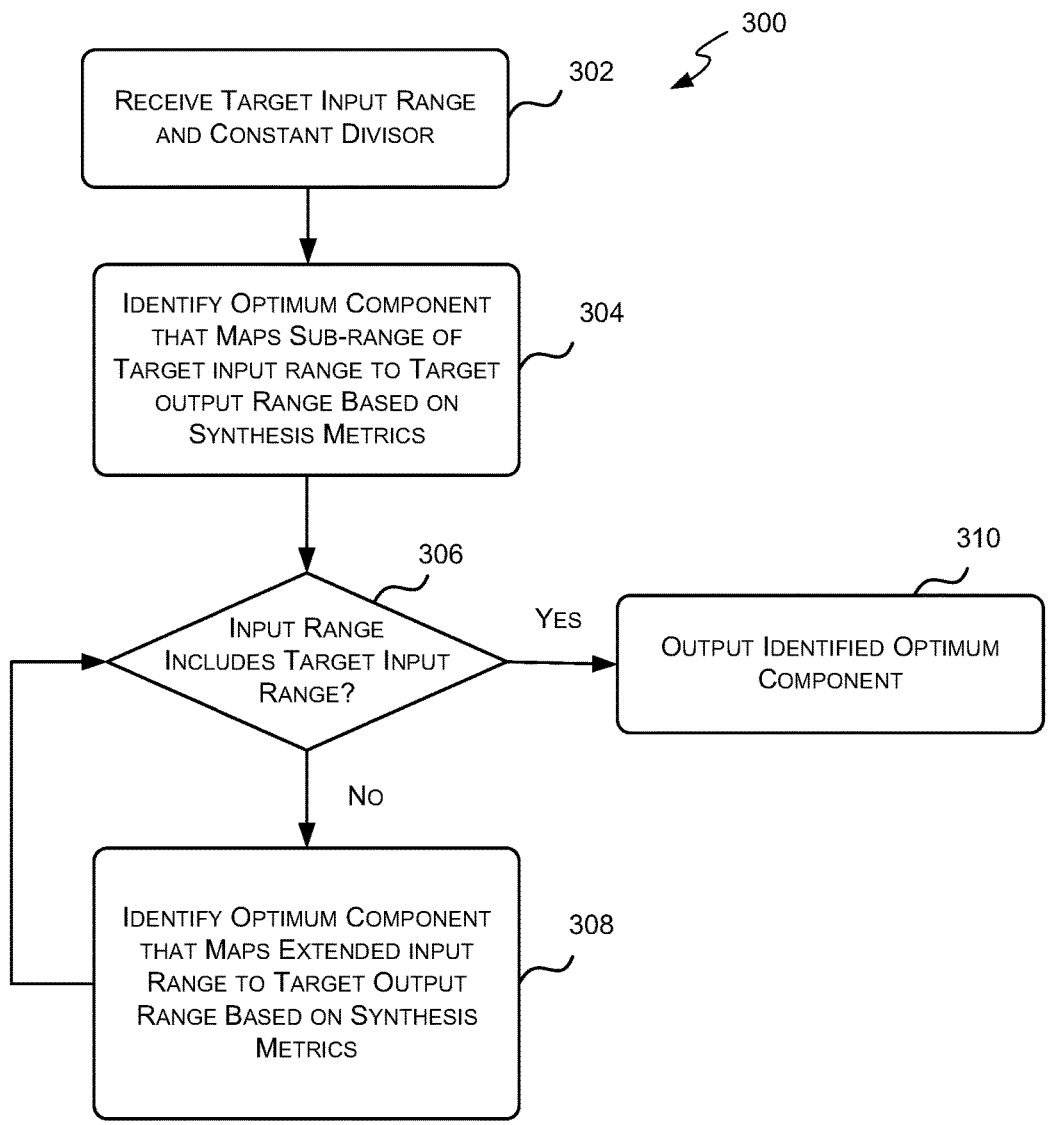
FIG. 3 is a flow diagram of an example method of generating a hardware design to implement a modulo operation.

Reference is now made to FIG. 3 which illustrates an example method 300 for generating a hardware design for a modulo operation which may be executed by the decision logic 206 of FIG. 2. The method 300 begins at block 302 where the decision logic 206 receives the target input range and the constant divisor (or constant value). As described above, the target input range may, for example, be specified by a minimum input number and a maximum input number; or by the number of bits n of the input. Once the target input range and the constant divisor have been received the method 300 proceeds to block 304.

At block 304 the decision logic 206 identifies an optimum component for mapping a sub-range of the target input range to the output range (e.g. [0, d−1]). The optimum component is identified by generating at least one component to map the small input range to the target output range using each of the range reduction modules 202, synthesizing the generated components using the synthesis module 204, and selecting one of the generated components based on synthesis metrics generated by the synthesis module 204. An example method for implementing block 304 which may be implemented by the decision logic 206 is described below with reference to FIG. 4. Once the decision logic 206 has selected the optimum component the method 300 proceeds to block 306.

At block 306 the decision logic 206 determines whether the input range for the optimum component comprises the target input range. As described in further detail below, in some cases the input range of a selected component may match the initially specified input range (e.g. if the initially specified input range is [0, 13] then the input range of the selected component is [0, 13]). However, in other cases the input range for a particular component may be larger than the initially specified input range (e.g. if the initially specified input range is [0, 13] the input range of the selected component may in fact be [0, 24]). If the input range of the selected component is greater than the initially specified input range then the selected component may be identified as the optimum component for the larger input range.

If the input range of the optimum component includes the target input range then no further stages are required and the method proceeds to block 310. If, however, the input range of the current stage does not encompass the target input range then at least one additional/different stage is required to map the entire target input range to the target output range and the method 300 proceeds to block 308.

At block 308, the decision logic 206 identifies the optimum component to map a larger input range than the input range of the optimum component selected in the previous iteration, to the target output range. For example, if the previously selected component is the optimum component for the input range of [0, 15] then the input range of the next component must be greater than [0, 15] (e.g. [0, 16]).

The component for the larger input range is selected by generating a primary component that maps the larger input range using each of the modulo preserving range reduction modules 202 (this primary component represents a range reduction stage which maps the input range to another range, the primary component may be used alone or in combination with an optimum component identified in a previous iteration to map the input range to the target output range); generating, for each generated component, a secondary component that maps the larger input range to the target output range by combining the generated component with one or none previously identified optimum components; synthesizing the secondary components using the synthesis module 204, and selecting one of the secondary components based on synthesis metrics generated by the synthesis module 204.

For example, if a first range reduction method generates a primary component that maps an input range of [0, 31] to an output range of [0, 15], but the target output range is [0, 12] then the primary component may be combined with a previously identified optimum component that maps an input range of [0, 15] to an output range of [0, 12] to generate a secondary component that maps the input range [0, 31] to the target output range [0, 12].

Joining components in this manner is based on the assumption that the best or optimum hardware design for performing the full modulo operation (i.e. mapping to the target output range [0, d−1]) that can be made with component X that maps to an output range [MinOut, MaxOut] is to feed the output of component X into the best component Y, chosen from the subset of previously found optimum components whose input range includes [MinOut, MaxOut] and whose output range is included in the target output range.

An example method for implementing block 308 which may be implemented by the decision logic 206 is described below with reference to FIG. 5. Once the decision logic 206 has identified an optimum component for mapping the larger input range to the target output range the method 300 proceeds back to block 306.

At block 310, once an optimum component has been identified for an input range that includes the entire target input range the optimum component is output as the modulo hardware design 102.

Figure 4:
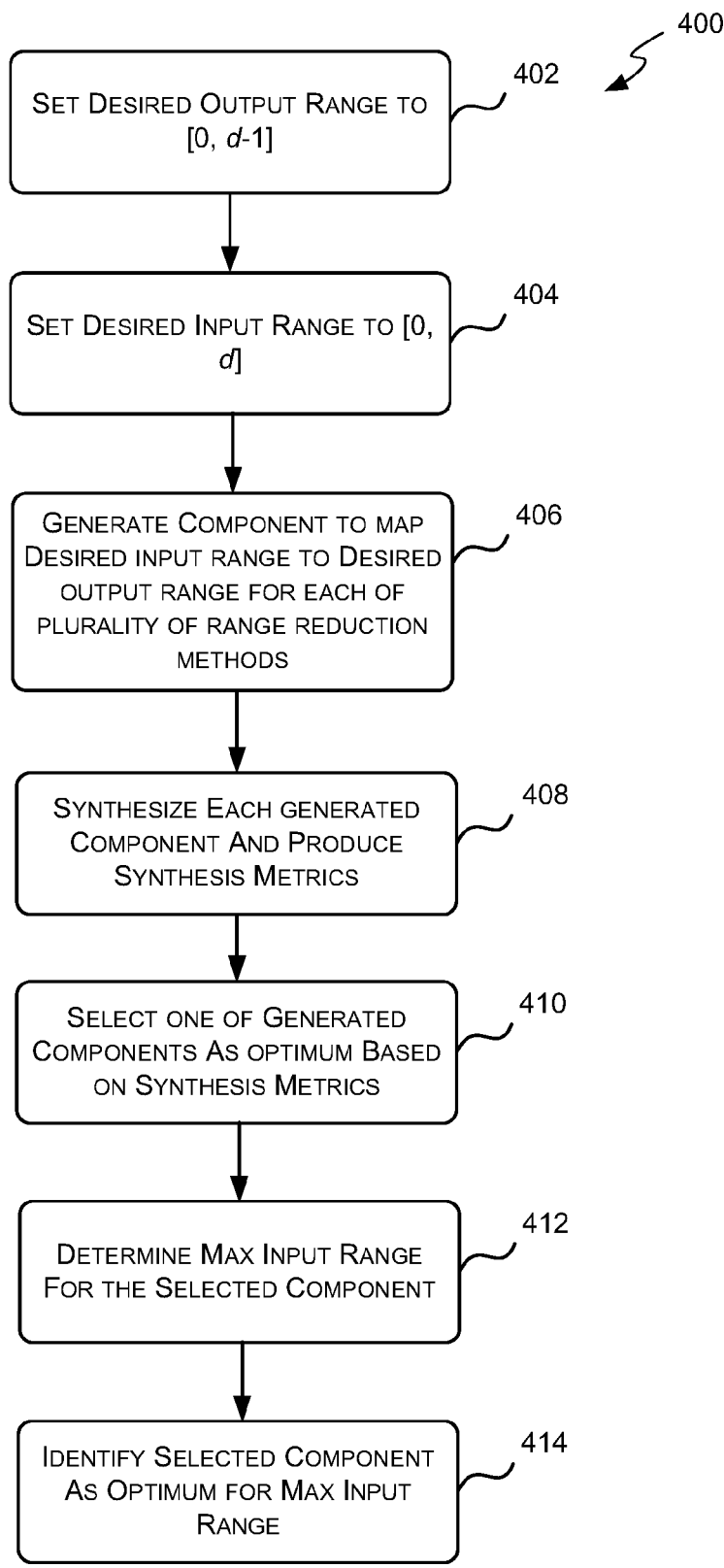
FIG. 4 is a flow diagram of an example method for selecting a component to implement a final range reduction stage of the hardware design.

Reference is now made to FIG. 4 which illustrates an example method 400 for implementing step 304 of the method 300 of FIG. 3 to select an optimum component for mapping a small input range to the target output range. The method 400 begins at blocks 402 and 404 where the decision logic 206 sets the desired output range to the target output range [0, d−1] where d is the constant divisor; and the decision logic 206 sets the desired input range to include at least one additional number over the target output range (e.g. the desired input range may be set to [0, d]). Once the desired input and output ranges have been set the method 400 proceeds to block 406.

At block 406, the decision logic 206 generates at least one component that maps the desired input range to the desired output range specified in blocks 402 and 404 using each modulo-preserving range reduction module 202. For example, where there are three range reduction modules 202 the decision logic 206 generates at least three components—a first component that maps the desired input range (e.g. [0, d]) to the desired output range (e.g. [0, d−1]) using a first range reduction method; a second component that maps the desired input range (e.g. [0, d]) to the desired output range (e.g. [0, d−1]) using a second range reduction method; and a third component that maps the desired input range (e.g. [0, d]) to the desired output range (e.g. [0, d−1]) using a third range reduction method.

At block 408, the synthesis module 204 synthesizes each of the components generated at block 406, analyzes the synthesized components, and produces synthesis metrics for each component based on the analysis. As described above, synthesizing a hardware design that is implemented in a hardware description language (HDL), such as VHDL, involves transforming the abstract form of the desired circuit behavior described by the HDL into a hardware implementation in terms of logic gates. The synthesis module 204 analyzes each synthesized component to assess the quality of the synthesis and then produces synthesis metrics that represent the analysis (e.g. delay, area, power).

Where, for example, the decision logic 206 generated three components at block 406 then the synthesis module 204 synthesizes each of the three components then analyzes each synthesized component to determine, for example, the delay associated with the component, area of the synthesized component, and/or the power usage of the component.

Once the components have been synthesized and the synthesis metrics generated the method 400 proceeds to block 410.

At block 410, the decision logic 206 selects one of the components generated at block 406 as the best or optimum component to map the desired input range to the desired output range (i.e. the target output range) based on the synthesis metrics. As described above, the decision logic 206 may receive selection criteria which indicate which metrics/features and the priority/combination thereof that should be used in selecting the best or optimum component. For example, the selection criteria may specify that delay is paramount causing the decision logic 206 to select the component that has the smallest delay. Once a component has been selected as the optimum component it is saved as an optimal component 208 so that it can be used in subsequent iterations. The method 400 then proceeds to block 412.

At block 412, the decision logic 206 determines the maximum input range for the selected component. In particular, while the selected component may have been generated to map the desired input range [0, d] to the desired output range [0, d−1] the component may be able to map a larger input range to the same output range without requiring any changes to the component. The maximum input range is defined as [0, MaxIn].

In some cases the decision logic 206 may determine the maximum input range of the selected component through simulation. For example, a simulation may be run which inputs successively increasing numbers into the component until the component does not produce the correct output (e.g. an output that is not within the target output range, or that does not preserve the modulo mapping).

In other cases the decision logic 206 may mathematically determine the maximum input range of the selected component based on the particular range reduction method that was used to generate the component. For example, if the unsigned multiples method is used to generate the component, the maximum input value is at most a value based on the number of input bits expected. A binary search method can then be used to find the actual maximum input range.

Once the maximum input range of the selected component has been determined the method 400 proceeds to block 414. In some cases, instead of determining the maximum input range for only the selected component the decision logic 206 may be configured to identify the maximum input range for each of the generated components and this information and its synthesis metrics can be stored along with the generated component for later use to prevent repeating the computation unnecessarily in later upstream stages.

At block 414, the decision logic 206 identifies the selected component to be the optimum component for mapping the maximum input range identified in block 412 (e.g. [0, MaxIn]) to the target output range. By doing this the decision logic 206 assumes that a component that is determined to be optimal for mapping an input range [MinIn, MaxIn] to an output range [MinOut, MaxOut], but is capable of mapping a larger input range [MinApplicable, MaxApplicable] to the same output range [MinOut, MaxOut] without any changes to the design is the optimal component for the larger input range. While this assumption does not always prove to be true it is true a significant proportion of the time. Further by making this assumption the number of optimal or best components that need to be generated and analyzed is significantly reduced thus allowing a hardware design component for a modulo operation to be generated more quickly. Once the input range of the selected optimum component has been set to the maximum input range the method 400 ends.

Figure 5:
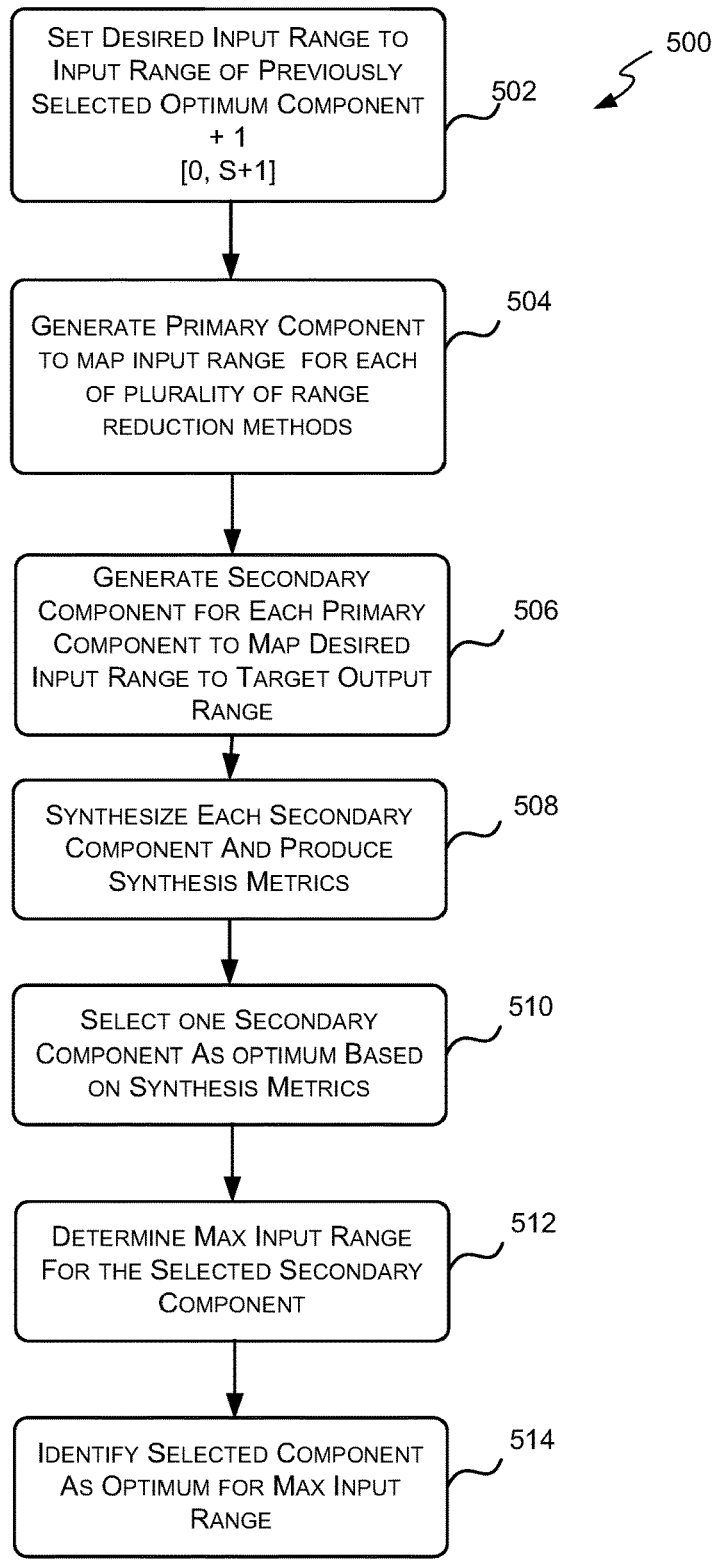
FIG. 5 is a flow diagram of an example method for selecting a component to implement an upstream range reduction stage of the hardware design.

Reference is now made to FIG. 5 which illustrates an example method 500 for implementing step 308 of the method of FIG. 3 to identify an optimum component for mapping a larger input range to the target output range.

The method 500 begins at block 502 where the decision logic 206 sets the desired input range to be the maximum input range of the optimum component identified in the previous iteration plus at least one additional number. For example, where the maximum input range of the previously select optimum component is [0, S] then the desired input range may be set to [0, S+1]. Once the desired input range has been set the method 500 proceeds to block 504.

At block 504, the decision logic 206 generates at least one primary component that maps the input range specified in block 502 using each modulo-preserving range reduction module 202. In other words the decision logic 206 generates at least one primary component that maps the desired input range using each range reduction method. For example, where there are three range reduction modules 202 the decision logic 206 uses the range reduction modules 202 to generate at least three primary components—a first primary component that maps the desired input range (e.g. [0, S+1]) using a first range reduction method; a second primary component that maps the input range (e.g. [0, S+1]) using a second range reduction method; and a third primary component that maps the desired input range (e.g. [0, S+1]).

As described above each primary component represents a range reduction stage which maps the input range to another range which may be used alone or in combination with a previously identified optimum component to map the input range to the target output range.

Once the primary components have been generated the method 500 proceeds to block 506.

At block 506, the decision logic 206 generates a secondary component for each primary component that maps the desired input range to the target output range by combining the primary component with one or none previously identified optimum components.

In particular, the decision logic 206 determines the output range of each primary component. The decision logic 206 may determine the output range of each primary component in the same manner as the decision logic 206 determines the maximum input range of a component. For example, the decision logic 206 may run a simulation to determine the output range, or the decision logic 206 may determine the output range mathematically.

Once the output range of each component has been determined the decision logic 206 determines for each primary component whether the output range matches the target output range. If the output range for a primary component matches the target output range then no further components/stages are required to map the desired input range to the target output range and the secondary component for that primary component is just the primary component.

If, however, the output range for a particular primary component is greater than the target output range then the decision logic 206 identifies a previously identified optimum component that can be combined with the primary component to map the desired input range to the target output range. In particular the decision logic 206 identifies, for each primary component that has an output range larger than the target output range, a previously identified optimal component that has an input range that the identified output range of the component falls within. For example, if the identified output range for a primary component is [0, 16] and there is a previously identified optimum component K that maps an input range of [0, 18] to the target output range [0, 12]; since the output range of the primary component [0, 16] falls within the target output range [0, 18], the primary component can be combined with previously identified optimum component K to map the desired input range to the target output range. A secondary component is then generated by feeding the primary component into the previously identified optimum component.

If the identified output range falls within the input range of more than one previously identified optimum component then in some cases the decision logic 206 may be configured to generate multiple secondary components (the primary component combined with each possible optimum component); and in other cases the decision logic 206 may be configured to select one of the optimum components to generate the secondary component. For example, the decision logic 206 may be configured to select the optimum component with the smaller input range.

Once at least one secondary component is generated for each primary component generated in block 504, the method 500 proceeds to block 508.

At block 508, the synthesis module 204 synthesizes each of the secondary components generated at block 506, analyzes the synthesized secondary components, and produces synthesis metrics for each secondary component based on the analysis. As described above synthesizing a hardware design that is implemented in a hardware description language (HDL), such as VHDL, involves transforming the abstract form of the desired circuit behavior described by the HDL into a hardware implementation in terms of logic gates. The synthesis module 204 analyzes the synthesized component to assess the quality of the synthesis and then produces synthesis metrics that represent the analysis (e.g. delay, area, power).

Where, for example, the decision logic 206 generated three secondary components at block 506, then the synthesis module 204 synthesizes each of the three secondary components, then analyzes each synthesized secondary component to generate synthesis metrics such as, but not limited to, the delay associated with the component, area of the synthesized component, and/or the power usage of the component.

Synthesizing the entire component which maps a desired input range to the target output range, allows hardware designs where one range reduction stage feeds particularly well into another range reduction stage to be selected over other hardware designs where the range reduction stages do not feed particularly well into one another. Further, synthesizing the entire component prevents any unexpected drops in QoR when the complete hardware design is synthesized. In particular, by synthesizing and analyzing the complete hardware design the synthesis metrics will include any overhead in connecting multiple range-reduction stages together.

Once the secondary components have been synthesized and the synthesis metrics generated the method 500 proceeds to blocks 510 to 514 where one of the secondary components is selected as the optimum component to map the desired input range to the target output range based on the synthesis metrics, the maximum input range for the selected secondary component is determined, and the selected secondary component is identified as the optimum component to map the maximum input range to the target output range. Blocks 510 to 514 generally correspond to blocks 410 to 414 of method 400 described above with reference to FIG. 4.

It is possible that a primary component generated in a subsequent iteration directly maps a larger input range to the same output range as a previously selected optimum component for a smaller input range. Where the primary component for the subsequent iteration is "better" according to the synthesis metrics, then the previously identified component may not end up forming part of the final hardware design.

For example, the decision logic 206 may identify the best component to map the input range [0, 20] to the output range [0, 12] to be component Z, and the best component to map the input range [0, 30] to the output range [0, 12] to be component Y. If the synthesis metrics indicate that component Y is preferred over component Z then component Z may be not be included in the final hardware design. However, this is likely to occur only rarely as a result of the synthesis metrics being noisy.

Figure 6:
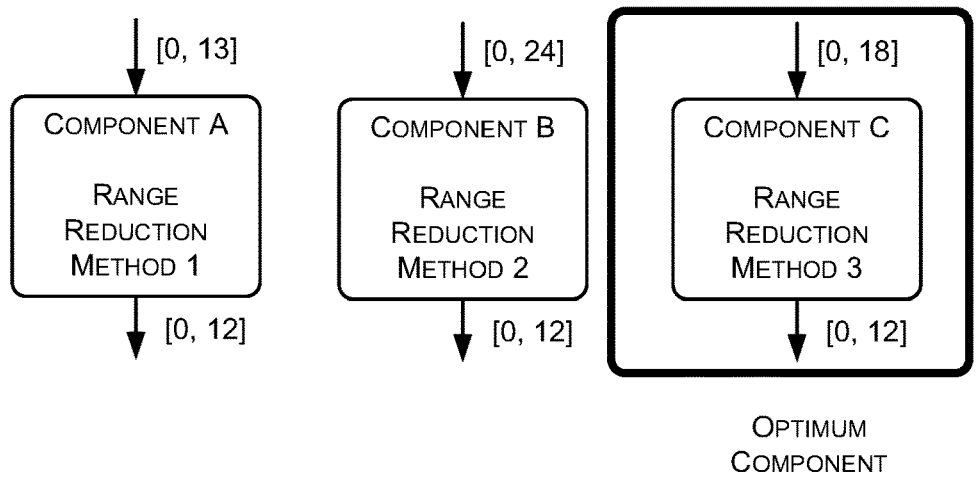
FIG. 6 is a schematic diagram illustrating the output of a first iteration of the method of FIG. 3 for generating an example hardware design for an example modulo operation.
Figure 7:
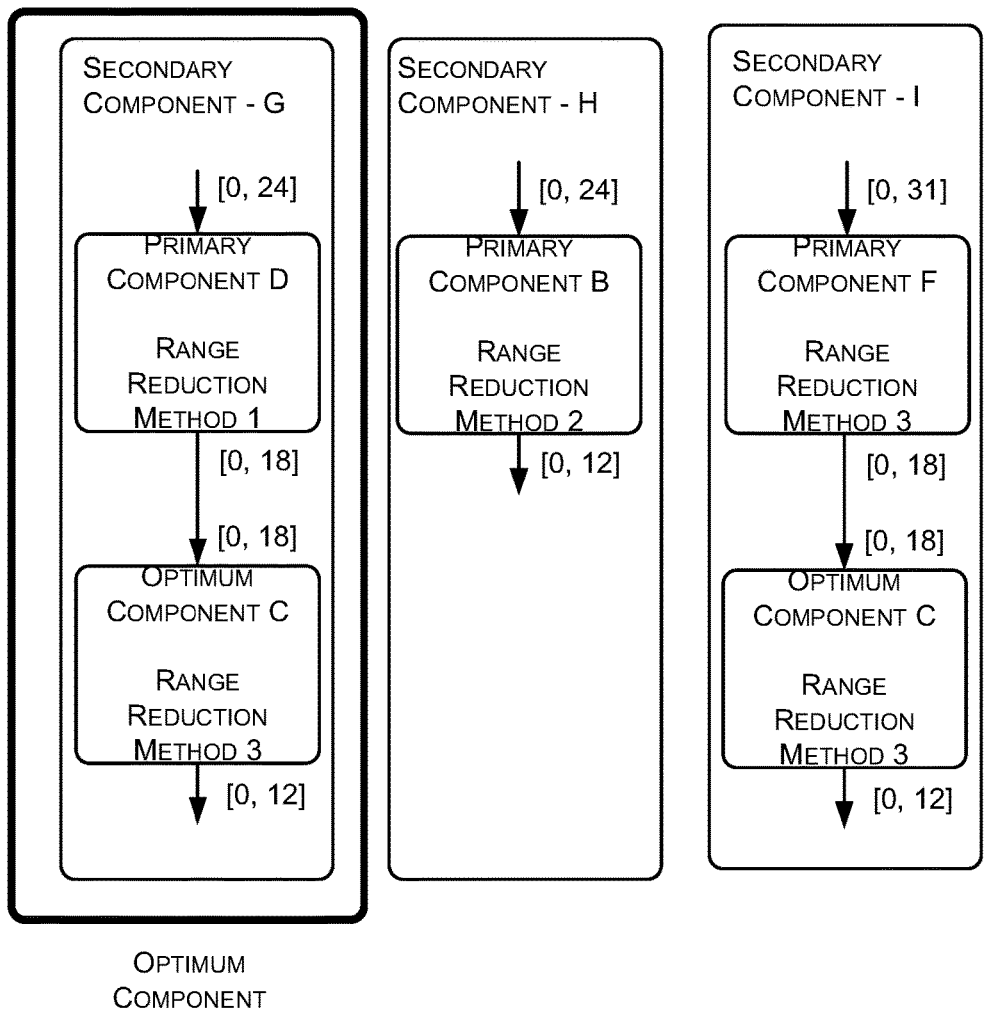
FIG. 7 is a schematic diagram illustrating the output of a second iteration of the method of FIG. 3 for generating an example hardware design for the example modulo operation of FIG. 6.
Figure 8:
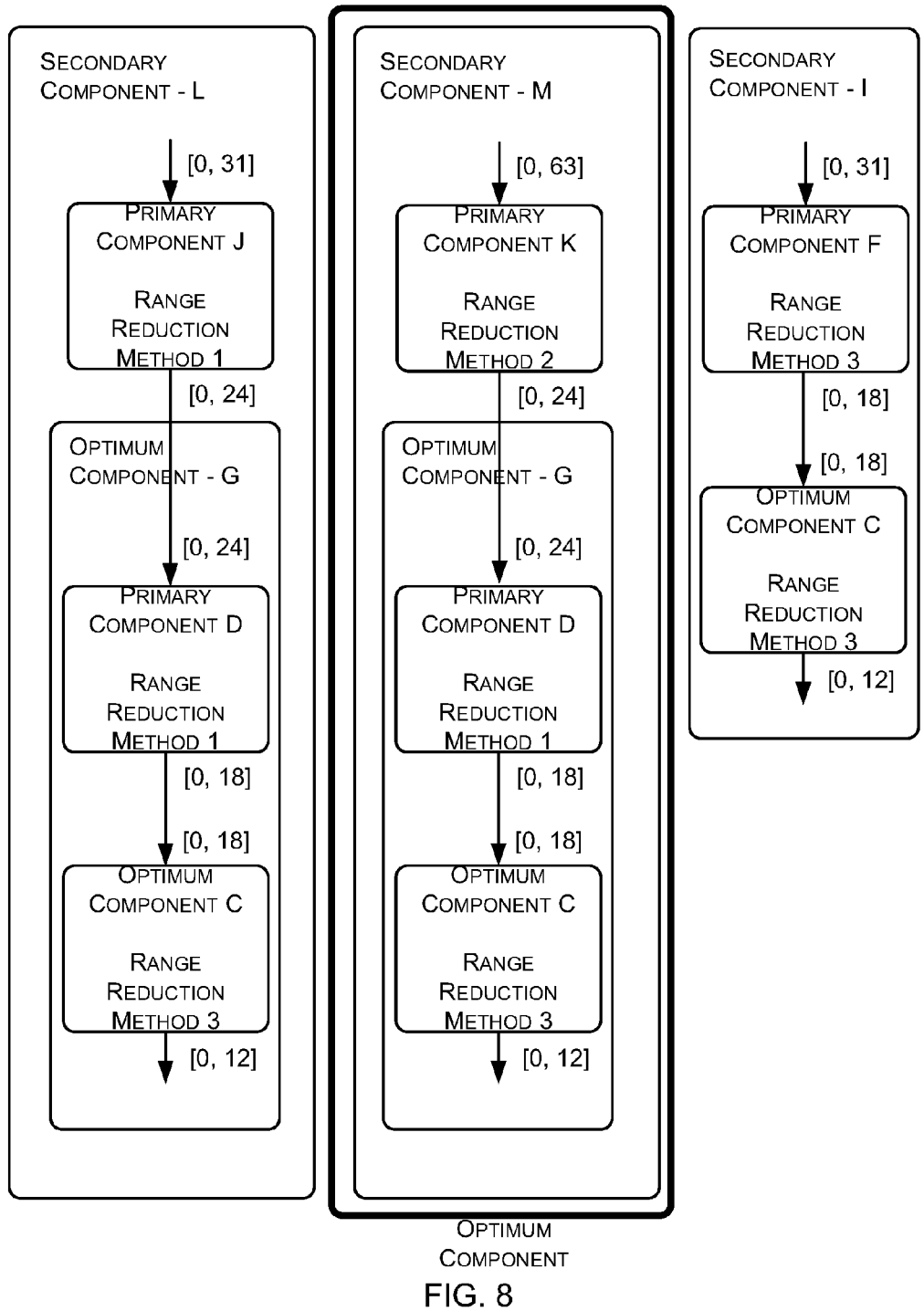
FIG. 8 is a schematic diagram illustrating the output of a third iteration of the method of FIG. 3 for generating an example hardware design for the example modulo operation of FIG. 6.
Figure 9:
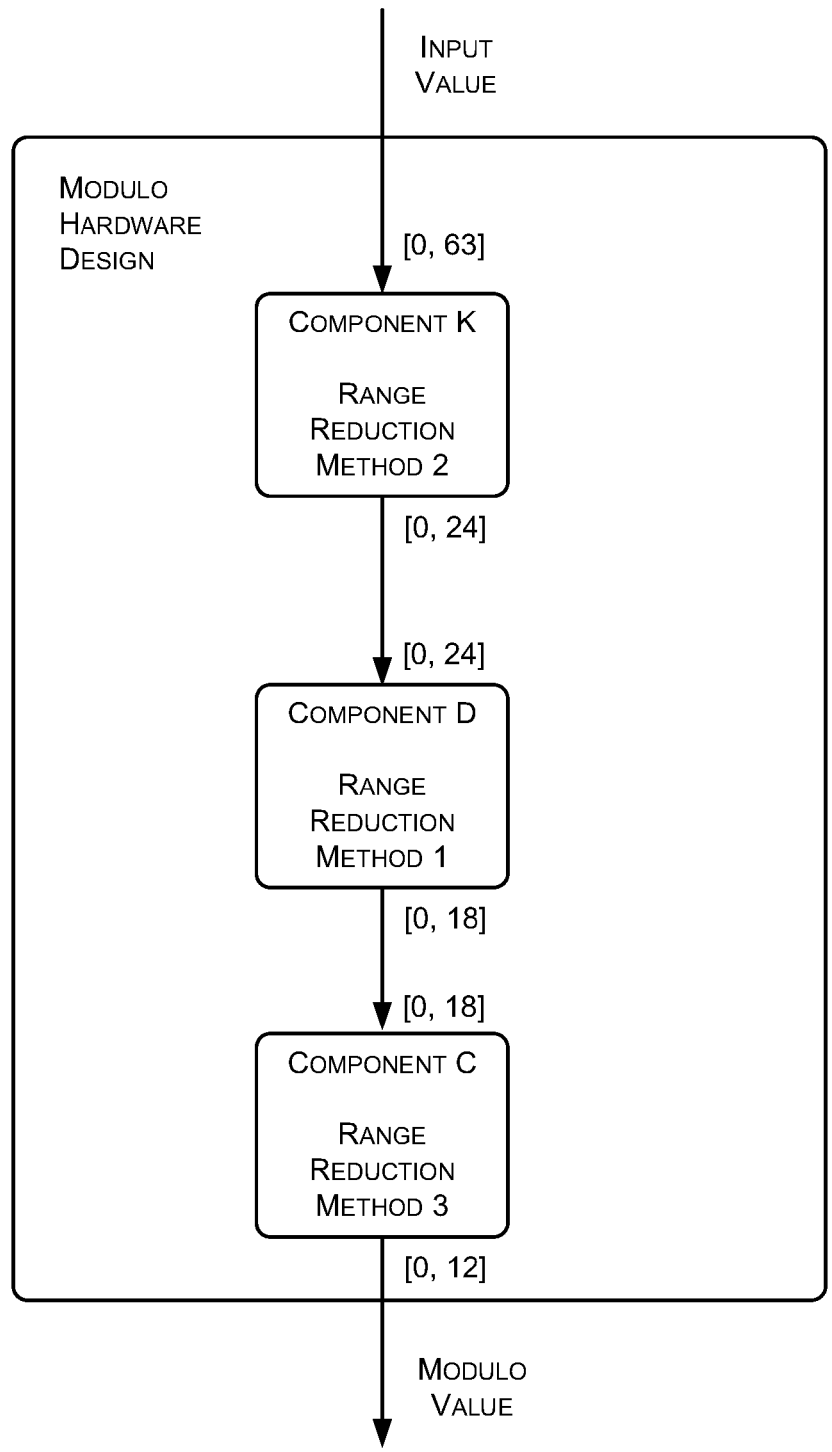
FIG. 9 is a block diagram of the example hardware design generated in the examples of FIGS. 6-8.

Reference is now made to FIGS. 6-9 which illustrate generating an example hardware design for an example modulo operation using the methods of FIGS. 3 to 5. In particular, FIG. 6 illustrates the results of the first iteration of the method; FIG. 7 illustrates the results of the second iteration of the method; FIG. 8 illustrates the results of the third iteration of the method; and FIG. 9 illustrates the resulting hardware design.

In the example of FIGS. 6 to 9 the example modulo operation to be implemented in hardware is defined by an input range of [0, 31] (e.g. n=5) and a constant divisor d of 13. Accordingly, what is desired is a hardware circuit to generate x mod 13 where x is a 5 bit unsigned integer.

In the first iteration, as shown in FIG. 6, an optimum component is identified for mapping a desired input range of [0, d]=[0, 13] to the target output range of [0, d−1]=[0, 12]. The first step is to generate a component to map the desired input range to the target output range using the three different reduction methods (labeled 1, 2 and 3). In particular, component A is generated using range reduction method 1, component B is generated using range reduction method 2, and component C is generated using range reduction method 3.

The generated components (A, B and C) are then synthesized and the best or optimal component is selected based on the synthesis metrics. In this example, component C is selected as the optimum component for mapping [0, 13] to [0, 12] based on the synthesis metrics.

It is determined that component C can actually map an input range of [0, 18] to the same output range of [0, 12] without altering component C, thus component C is identified as the optimal component for mapping the input range [0, 18] to the output range [0, 12]. Since the input range of component C does not cover the entire target input range of [0, 31] at least one additional/different range-reduction stage needs to be used to map the target input range to the target output range.

In the second iteration, as shown in FIG. 7, an optimum component is identified for mapping an expanded input range to the target output range. The expanded input range is set to [0, 19] to include one additional number over the input range of the optimal component C identified in the first iteration.

The first step is to generate a primary component to map the desired input range using the three different reduction methods. In particular a new primary component D is generated using the range reduction method 1; and a new primary component F is generated using range reduction method 3. However, since component B generated using range reduction method 2 is capable of mapping an input range of [0, 24] to [0, 12] this is the primary component that is used for range reduction method 2.

The output range of the primary components D, B and F are identified as [0, 18], [0, 12] and [0, 18] respectively. Since component B maps directly to the target output range [0, 12] primary component B becomes the secondary component H. However, since primary components D and F have an output range that is greater than the target output range they are combined with a previously identified optimum component. In this case the only identified optimum component is component C. The input range of component C includes the output range of both components D and F thus secondary components G and I are generated by combining primary components D and F respectively with optimum component C.

The secondary components (G, H and I) are then synthesized and the best or optimal secondary component is selected based on the synthesis metrics. In this example, secondary component G is selected as the optimum component for mapping [0, 19] to [0, 12] based on the synthesis metrics.

It is determined that secondary component G can actually map an input range of [0, 24] to the same output range of [0, 12] without altering component G, thus component G is selected as the optimal component for mapping the input range [0, 24] to the output range [0, 12].

In the third iteration, as shown in FIG. 8, an optimum component is identified for mapping an expanded input range to the target output range. The expanded input range is set to [0, 25] to include one additional number over the input range of the optimal component G identified in the second iteration.

The first step is to generate a primary component to map the desired input range using the three different reduction methods. In particular a new primary component J is generated using the range reduction method 1; and a new primary component K is generated using range reduction method 2. However, since component F generated using range reduction method 3 is capable of mapping an input range of [0, 24] to [0, 12] this is the primary component that is used for range reduction method 3.

The output range of the primary components J, K and F are identified as [0, 24], [0, 24] and [0, 18] respectively.

Since each of the primary components J, K and F have an output range that is greater than the target output range they are combined with a previously identified optimum component to generate a secondary component. In this case there are two identified optimum components—C and G. The input range of optimum component G includes the output range of both primary components J and K thus secondary components L and M are generated by combining primary components J and K respectively with optimum component G. The input range of component C includes the output range of component F thus secondary component I is generated by combining primary component F and optimum component C.

The secondary components (L, M and I) are then synthesized and the best or optimal secondary component is selected based on the synthesis metrics. In this example, secondary component M is selected as the optimum component for mapping [0, 25] to [0, 12] based on the synthesis metrics.

It is determined that secondary component M can actually map an input range of [0, 63] to the same output range of [0, 12] without altering component M, thus component M is selected as the optimal component for mapping the input range [0, 63] to the target output range [0, 12]. Since the input range of component M includes the target input range of [0, 31] no further/different range reduction stages are needed thus the method ends.

FIG. 9 shows the resulting hardware design that comprises three range reduction stages. In the first stage component K maps an input range of [0, 63] to an output range of [0, 24] using range reduction method 2. In a second stage component D maps an in input range of [0, 24] to an output range of [0, 18] using range reduction method 1. In the third and final stage component C maps an input range of [0, 18] to the target output range [0, 12] using range reduction method 3.

Figure 10:
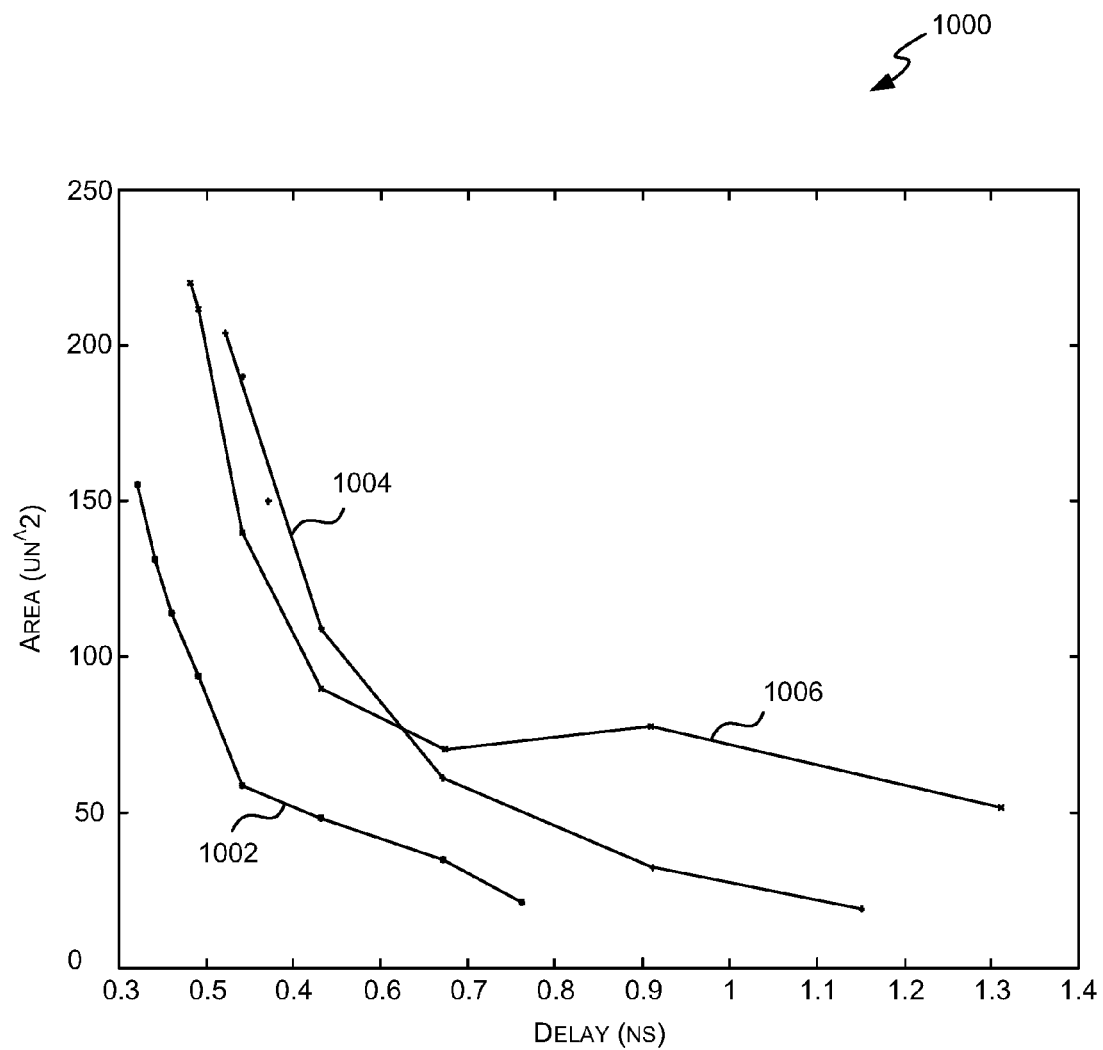
FIG. 10 is a graph showing the area compared to delay time of a hardware design generated using the method of FIG. 3 to implement a modulo operation for a first input range and a first divisor.
Figure 11:
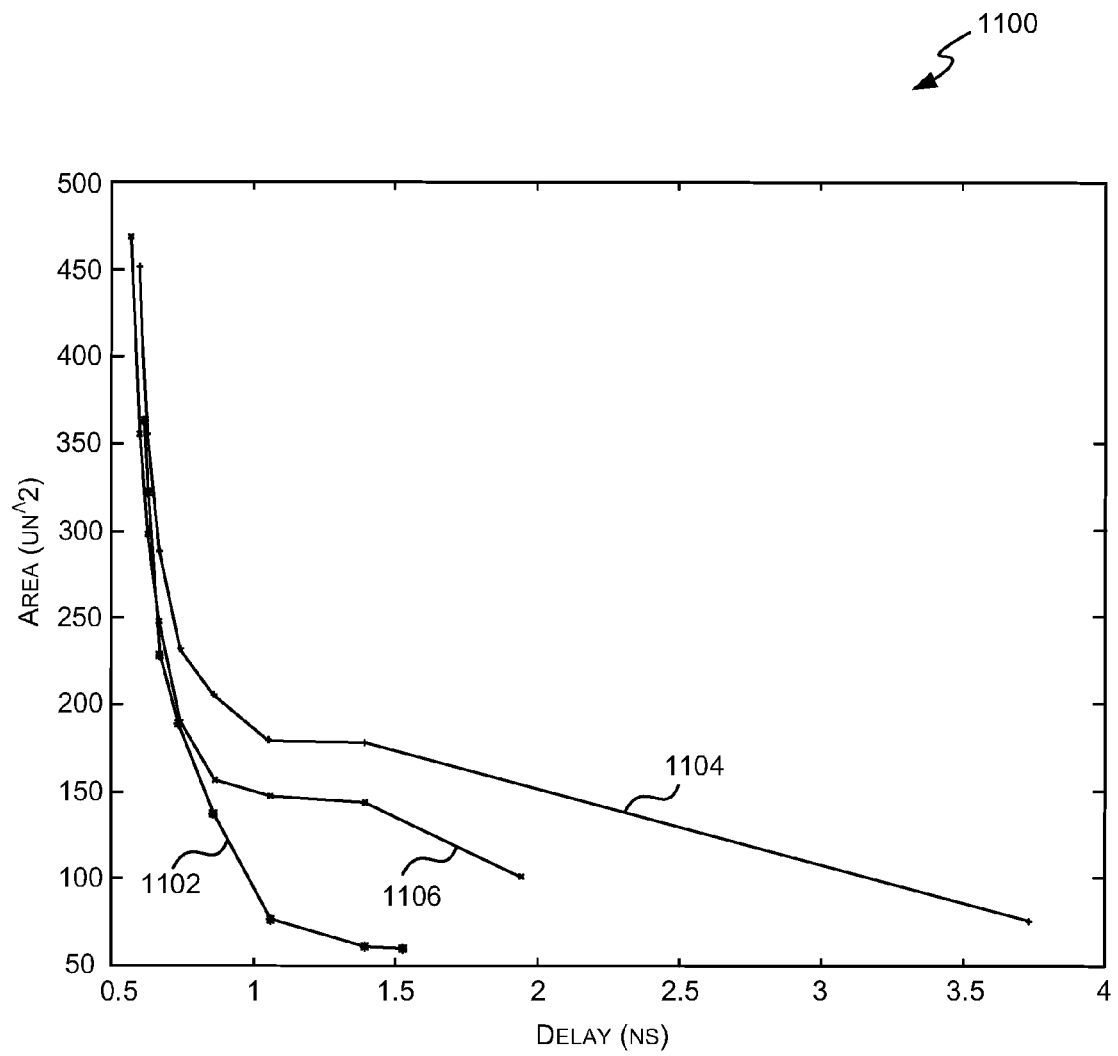
FIG. 11 is a graph showing the area compared to delay time of a hardware design generated using the method of FIG. 3 to implement a modulo operation for a second input range and a second divisor.
Figure 12:
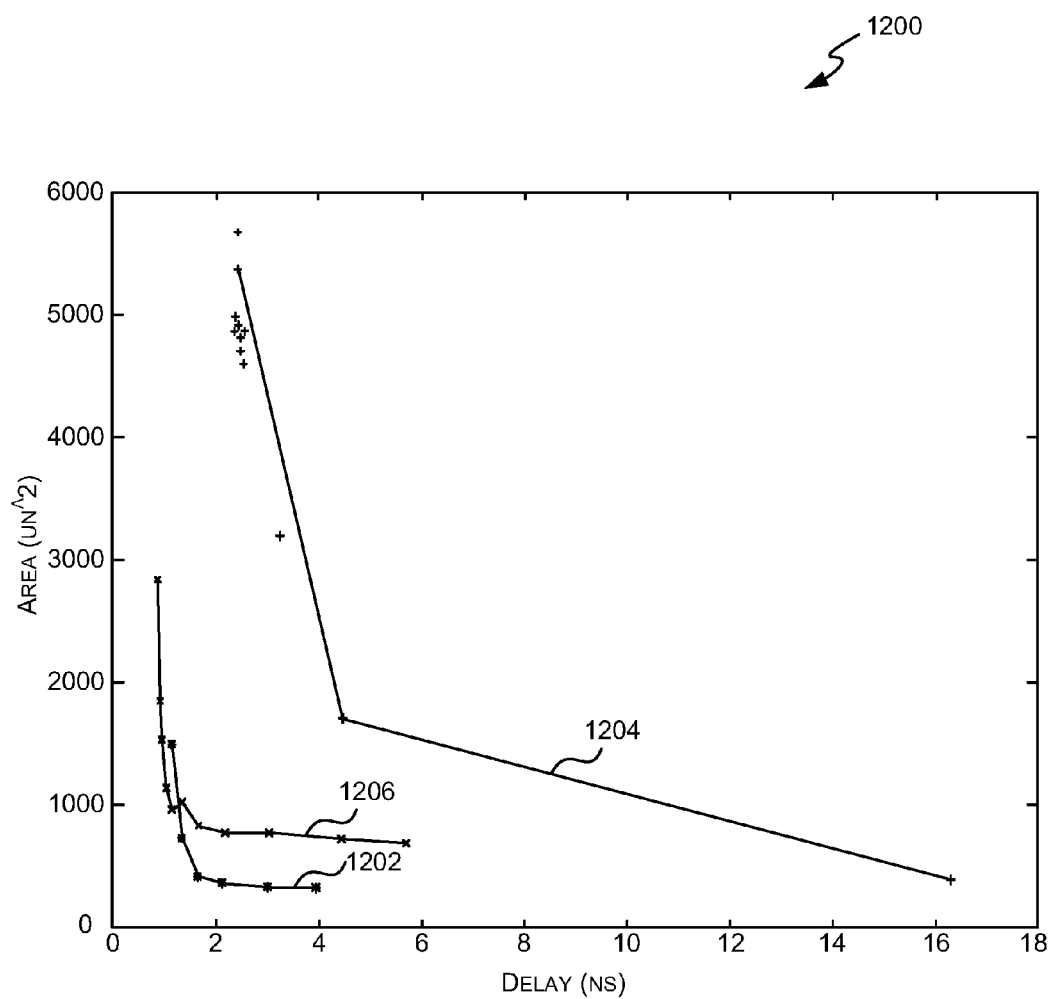
FIG. 12 is a graph showing the area compared to delay time of a hardware design generated using the method of FIG. 3 to implement a modulo operation for a third input range and a third divisor.

Reference is now made to FIGS. 10 to 12 which illustrate graphs that show the QoR improvement of modulo operation circuits generated in accordance with the methods described herein compared to modulo operation circuits generated using other methods.

In particular FIG. 10 illustrates the area of modulo operation circuits for an input x with 11 bits and a divisor of 6 compared to delay time in nanoseconds (i.e. the time for the modulo value to be produced). Curve 1002 shows the area and delay time of such a modulo operation circuit generated in accordance with the methods described herein; curve 1004 shows the area and delay time of such a modulo operation circuit generated using a DesignWare™ tool that generates the modulo value by taking the remainder out of a standard division component of x/d; and curve 1006 shows the area and delay time of such a modulo operation circuit generated using an optimized constant divisional component to find the division=floor(x/d) and then returning the result=x−(division*d). It can be seen that the modulo operation circuit generated in accordance with the methods described herein may produce a significantly better QoR than the modulo operation circuits produced by the other two methods.

FIG. 11 illustrates the area of modulo operation circuits for an input x with 16 bits and a divisor of 13 compared to delay time in nanoseconds (i.e. the time for the modulo value to be produced). Curve 1102 shows the area and delay time of such a modulo operation circuit generated in accordance with the methods described herein; curve 1104 shows the area and delay time of such a modulo operation circuit generated using a DesignWare™ tool that generates the modulo value by taking the remainder out of a standard division component of x/d; and curve 1106 shows the area and delay time of such a modulo operation circuit generated using an optimized constant divisional component to find the division=floor(x/d) and then returning the result=x−(division*d). It can be seen that the modulo operation circuit generated in accordance with the methods described herein may produce a significantly better QoR than the modulo operation circuits produced by the other two methods.

FIG. 12 illustrates the area of modulo operation circuits for an input x with 32 bits and a divisor of 3139 compared to delay time in nanoseconds (i.e. the time for the modulo value to be produced). Curve 1202 shows the area and delay time of such a modulo operation circuit generated in accordance with the methods described herein; curve 1204 shows the area and delay time of such a modulo operation circuit generated using a DesignWare™ tool that generates the modulo value by taking the remainder out of a standard division component of x/d; and curve 1206 shows the area and delay time of such a modulo operation circuit generated using an optimized constant divisional component to find the division=floor(x/d) and then returning the result=x−(division*d). It can be seen that the modulo operation circuit generated in accordance with the methods described herein may produce a significantly better QoR than the modulo operation circuits produced by the other two methods.

Figure 13:
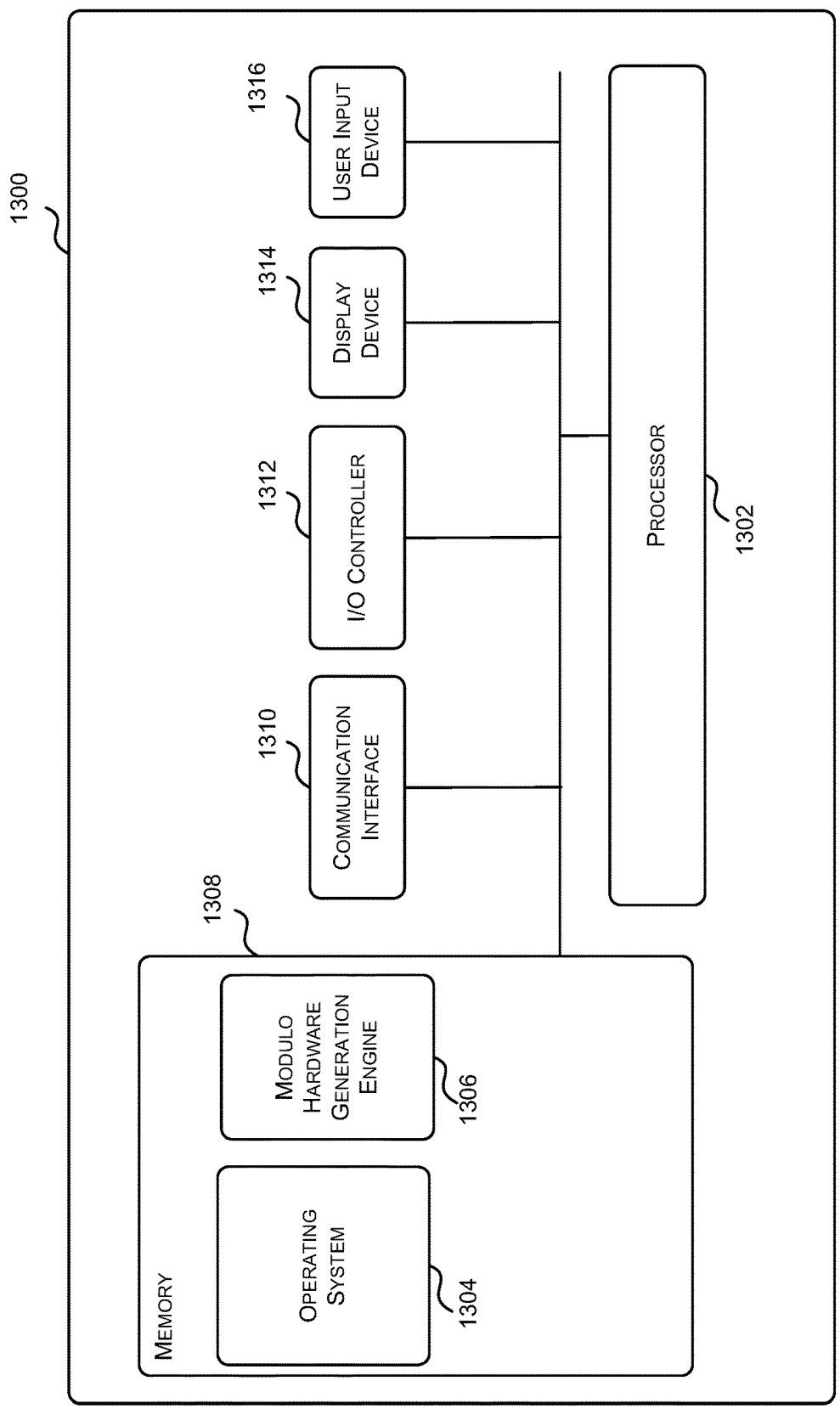
FIG. 13 is an example computing-based device.

FIG. 13 illustrates various components of an exemplary computing-based device 1300 which may be implemented as any form of a computing and/or electronic device, and in which embodiments of the methods and engines described herein may be implemented.

Computing-based device 1300 comprises one or more processors 1102 which may be microprocessors, controllers or any other suitable type of processors for processing computer executable instructions to control the operation of the device in order to generate a hardware design to implement a modulo operation. In some examples, for example where a system on a chip architecture is used, the processors 1302 may include one or more fixed function blocks (also referred to as accelerators) which implement a part of the method of FIG. 3 in hardware (rather than software or firmware). Platform software comprising an operating system 1304 or any other suitable platform software may be provided at the computing-based device to enable application software, such as the modulo hardware generation engine 1306 to be executed on the device.

The computer executable instructions may be provided using any computer-readable media that is accessible by computing based device 1300. Computer-readable media may include, for example, computer storage media such as memory 1308 and communications media. Computer storage media (i.e. non-transitory machine readable media), such as memory 1308, includes volatile and non-volatile, removable and non-removable media implemented in any method or technology for storage of information such as computer readable instructions, data structures, program modules or other data. Computer storage media includes, but is not limited to, RAM, ROM, EPROM, EEPROM, flash memory or other memory technology, CD-ROM, digital versatile disks (DVD) or other optical storage, magnetic cassettes, magnetic tape, magnetic disk storage or other magnetic storage devices, or any other non-transmission medium that can be used to store information for access by a computing device. In contrast, communication media may embody computer readable instructions, data structures, program modules, or other data in a modulated data signal, such as a carrier wave, or other transport mechanism. As defined herein, computer storage media does not include communication media. Although the computer storage media (i.e. non-transitory machine readable media, e.g. memory 1308) is shown within the computing-based device 1300 it will be appreciated that the storage may be distributed or located remotely and accessed via a network or other communication link (e.g. using communication interface 1310).

The computing-based device 1300 also comprises an input/output controller 1312 arranged to output display information to a display device 1314 which may be separate from or integral to the computing-based device 1300. The display information may provide a graphical user interface. The input/output controller 1312 is also arranged to receive and process input from one or more devices, such as a user input device 1316 (e.g. a mouse or a keyboard). This user input device 1316 may be used to provide the input range, divisor and/or selection criteria. In an embodiment the display device 1314 may also act as the user input device 1316 if it is a touch sensitive display device. The input/output controller 1312 may also output data to devices other than the display device, e.g. a locally connected printing device (not shown in FIG. 13).

An example of processing an integrated circuit definition dataset at an integrated circuit manufacturing system so as to configure the system to manufacture an electronic device will now be described with respect to FIG. 14.

Figure 14:
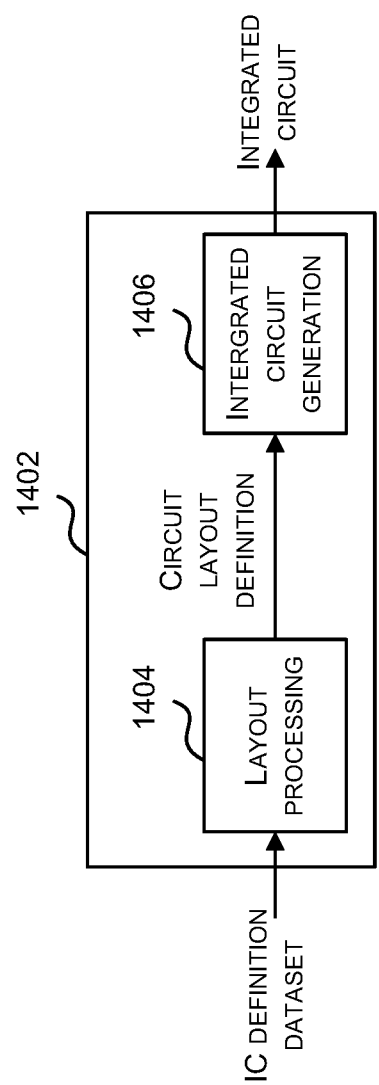
FIG. 14 is a block diagram of an example integrated circuit manufacturing system.

FIG. 14 shows an example of an integrated circuit (IC) manufacturing system 1402 which comprises a layout processing system 1404 and an integrated circuit generation system 1406. The IC manufacturing system 1402 is configured to receive an IC definition dataset (e.g. a hardware design such as a modulo hardware design 102 described herein), process the IC definition dataset, and generate an IC according to the IC definition dataset. The processing of the IC definition dataset configures the IC manufacturing system 1402 to manufacture an integrated circuit in accordance with the IC definition dataset. More specifically, the layout processing system 1404 is configured to receive and process the IC definition dataset to determine a circuit layout. Methods of determining a circuit layout from an IC definition dataset are known in the art, and for example may involve synthesising RTL code to determine a gate level representation of a circuit to be generated, e.g. in terms of logical components (e.g. NAND, NOR, AND, OR, MUX and FLIP-FLOP components). A circuit layout can be determined from the gate level representation of the circuit by determining positional information for the logical components. This may be done automatically or with user involvement in order to optimise the circuit layout. When the layout processing system 1404 has determined the circuit layout it may output a circuit layout definition to the IC generation system 1406. The IC generation system 1406 generates an IC according to the circuit layout definition, as is known in the art. For example, the IC generation system 1406 may implement a semiconductor device fabrication process to generate the IC, which may involve a multiple-step sequence of photo lithographic and chemical processing steps during which electronic circuits are gradually created on a wafer made of semiconducting material. The circuit layout definition may be in the form of a mask which can be used in a lithographic process for generating an IC according to the circuit definition. Alternatively, the circuit layout definition provided to the IC generation system 1406 may be in the form of computer-readable code which the IC generation system 1406 can use to form a suitable mask for use in generating an IC. The different processes performed by the IC manufacturing system 1402 may be implemented all in one location, e.g. by one party. Alternatively, the IC manufacturing system 1402 may be a distributed system such that some of the processes may be performed at different locations, and may be performed by different parties. For example, some of the stages of: (i) synthesising RTL code representing the IC definition dataset to form a gate level representation of a circuit to be generated, (ii) generating a circuit layout based on the gate level representation, (iii) forming a mask in accordance with the circuit layout, and (iv) fabricating an integrated circuit using the mask, may be performed in different locations and/or by different parties.

In other examples, processing of the integrated circuit definition dataset at an integrated circuit manufacturing system may configure the system to manufacture an electronic device (e.g. hardware to calculate a modulo value) without the IC definition dataset being processed so as to determine a circuit layout. For instance, an integrated circuit definition dataset may define the configuration of a reconfigurable processor, such as an FPGA, and the processing of that dataset may configure an IC manufacturing system to generate a reconfigurable processor having that defined configuration (e.g. by loading configuration data to the FPGA).

In some examples, an integrated circuit definition dataset could include software which runs on hardware defined by the dataset or in combination with hardware defined by the dataset. In the example shown in FIG. 14, the IC generation system may further be configured by an integrated circuit definition dataset to, on manufacturing an integrated circuit, load firmware onto that integrated circuit in accordance with program code defined at the integrated circuit definition dataset or otherwise provide program code with the integrated circuit for use with the integrated circuit.

The term 'processor' and 'computer' are used herein to refer to any device, or portion thereof, with processing capability such that it can execute instructions. The term 'processor' may, for example, include central processing units (CPUs), graphics processing units (GPUs or VPUs), physics processing units (PPUs), radio processing units (RPUs), digital signal processors (DSPs), general purpose processors (e.g. a general purpose GPU), microprocessors, any processing unit which is designed to accelerate tasks outside of a CPU, etc. Those skilled in the art will realize that such processing capabilities are incorporated into many different devices and therefore the term 'computer' includes set top boxes, media players, digital radios, PCs, servers, mobile telephones, personal digital assistants and many other devices.

Those skilled in the art will realize that storage devices utilized to store program instructions can be distributed across a network. For example, a remote computer may store an example of the process described as software. A local or terminal computer may access the remote computer and download a part or all of the software to run the program. Alternatively, the local computer may download pieces of the software as needed, or execute some software instructions at the local terminal and some at the remote computer (or computer network). Those skilled in the art will also realize that by utilizing conventional techniques known to those skilled in the art that all, or a portion of the software instructions may be carried out by a dedicated circuit, such as a DSP, programmable logic array, or the like.

The methods described herein may be performed by a computer configured with software in machine readable form stored on a tangible storage medium e.g. in the form of a computer program comprising computer readable program code for configuring a computer to perform the constituent portions of described methods or in the form of a computer program comprising computer program code means adapted to perform all the steps of any of the methods described herein when the program is run on a computer and where the computer program may be embodied on a computer readable storage medium. Examples of tangible (or non-transitory) storage media include disks, thumb drives, memory cards etc. and do not include propagated signals. The software can be suitable for execution on a parallel processor or a serial processor such that the method steps may be carried out in any suitable order, or simultaneously.

The hardware components described herein may be generated by a non-transitory computer readable storage medium having encoded thereon computer readable program code.

It is also intended to encompass software which "describes" or defines the configuration of hardware that implements a module, functionality, component or logic described above, such as HDL (hardware description language) software, as is used for designing integrated circuits, or for configuring programmable chips, to carry out desired functions. That is, there may be provided a computer readable storage medium having encoded thereon computer readable program code for generating a processing unit configured to perform any of the methods described herein, or for generating a processing unit comprising any apparatus described herein. That is, a computer system may be configured to generate a representation of a digital circuit from definitions of circuit elements and data defining rules for combining those circuit elements, wherein a non-transitory computer readable storage medium may have stored thereon processor executable instructions that when executed at such a computer system, cause the computer system to generate a processing unit as described herein. For example, a non-transitory computer readable storage medium may have stored thereon computer readable instructions that, when processed at a computer system for generating a manifestation of an integrated circuit, cause the computer system to generate a manifestation of a processor as described in the examples herein or to generate a manifestation of a processor configured to perform a method as described in the examples herein. The manifestation of a processor could be the processor itself, or a representation of the processor (e.g. a mask) which can be used to generate the processor.

Memories storing machine executable data for use in implementing disclosed aspects can be non-transitory media. Non-transitory media can be volatile or non-volatile. Examples of volatile non-transitory media include semiconductor-based memory, such as SRAM or DRAM. Examples of technologies that can be used to implement non-volatile memory include optical and magnetic memory technologies, flash memory, phase change memory, resistive RAM.

A particular reference to "logic" refers to structure that performs a function or functions. An example of logic includes circuitry that is arranged to perform those function(s). For example, such circuitry may include transistors and/or other hardware elements available in a manufacturing process. Such transistors and/or other elements may be used to form circuitry or structures that implement and/or contain memory, such as registers, flip flops, or latches, logical operators, such as Boolean operations, mathematical operators, such as adders, multipliers, or shifters, and interconnect, by way of example. Such elements may be provided as custom circuits or standard cell libraries, macros, or at other levels of abstraction. Such elements may be interconnected in a specific arrangement. Logic may include circuitry that is fixed function and circuitry can be programmed to perform a function or functions; such programming may be provided from a firmware or software update or control mechanism. Logic identified to perform one function may also include logic that implements a constituent function or sub-process. In an example, hardware logic has circuitry that implements a fixed function operation, or operations, state machine or process.

Any range or device value given herein may be extended or altered without losing the effect sought, as will be apparent to the skilled person.

It will be understood that the benefits and advantages described above may relate to one embodiment or may relate to several embodiments. The embodiments are not limited to those that solve any or all of the stated problems or those that have any or all of the stated benefits and advantages.

Any reference to 'an' item refers to one or more of those items. The term 'comprising' is used herein to mean including the method blocks or elements identified, but that such blocks or elements do not comprise an exclusive list and an apparatus may contain additional blocks or elements and a method may contain additional operations or elements. Furthermore, the blocks, elements and operations are themselves not impliedly closed.

The steps of the methods described herein may be carried out in any suitable order, or simultaneously where appropriate. The arrows between boxes in the figures show one example sequence of method steps but are not intended to exclude other sequences or the performance of multiple steps in parallel. Additionally, individual blocks may be deleted from any of the methods without departing from the spirit and scope of the subject matter described herein. Aspects of any of the examples described above may be combined with aspects of any of the other examples described to form further examples without losing the effect sought. Where elements of the figures are shown connected by arrows, it will be appreciated that these arrows show just one example flow of communications (including data and control messages) between elements. The flow between elements may be in either direction or in both directions.

It will be understood that the above description of a preferred embodiment is given by way of example only and that various modifications may be made by those skilled in the art. Although various embodiments have been described above with a certain degree of particularity, or with reference to one or more individual embodiments, those skilled in the art could make numerous alterations to the disclosed embodiments without departing from the spirit or scope of this invention.

The invention claimed is:

1. A computer-implemented method of generating a hardware design to calculate a modulo value for any integer input value in a target input range with respect to a constant divisor d, the hardware design comprising one or more range reduction stages, the method comprising in a processing module:
   (a) generating at least one hardware design component to map a desired input range to a target output range using each of a plurality of modulo preserving range reduction methods;
   (b) synthesizing each of the hardware design components;
   (c) selecting one of the hardware design components as an optimum hardware design component for the desired input range based on the synthesis;
   (d) determining whether a maximum input range of the optimum hardware design component comprises the target input range;

(e) in response to determining that the maximum input range of the optimum hardware design component does not comprise the target input range, expanding the desired input range and repeating steps (a) to (d) for the expanded desired input range; and (f) in response to determining that the maximum input range of the optimum hardware design component comprises the target input range, outputting the optimum hardware design component.

2. The method of claim 1, wherein the desired input range is initially set to [0, d].

3. The method of claim 1, wherein expanding the desired input range comprises setting the desired input range to the maximum input range of the optimum hardware design component and increasing the desired input range to include at least one additional number.

4. The method of claim 1, wherein each hardware design component is associated with one of the plurality of modulo preserving range reduction methods and generating a particular hardware design component comprises generating a primary hardware design component that uses the associated modulo preserving range reduction method to map the desired input range.

5. The method of claim 4, wherein generating the particular hardware design component further comprises:
identifying an output range of the primary hardware design component;
determining whether the identified output range of the primary hardware design component is greater than the target output range; and
in response to determining that the identified output range of the primary hardware design component is greater than the target output range, combining the primary hardware design component with a previously identified optimum hardware design component to generate the particular hardware design component.

6. The method of claim 1, further comprising, analyzing the synthesized hardware design components and generating one or more synthesis metrics for each synthesized hardware design component based on the analysis; and wherein the selection of one of the hardware design components as the optimum hardware design component for the desired input range is based on the one or more synthesis metrics.

7. The method of claim 6, wherein the one or more synthesis metrics comprise one or more of delay, area, and power usage to produce a modulo value.

8. The method of claim 6, wherein the method further comprises receiving selection criteria and the selection of one of the hardware design components as the optimum hardware design component for the desired input range is based on the one or more synthesis metrics and the selection criteria.

9. The method of claim 1, wherein the hardware design comprises computer readable instructions that, when processed at an integrated circuit manufacturing system, cause the integrated circuit manufacturing system to generate a manifestation of an integrated circuit to calculate the modulo value.

10. A computer readable storage medium having stored thereon a hardware design to calculate a modulo value that was generated according to the method as set forth in claim 1 that, when processed in an integrated circuit manufacturing system, configures the integrated circuit manufacturing system to generate a manifestation of an integrated circuit to calculate the modulo value.

11. An integrated circuit implementing a hardware design to calculate a modulo value that was generated according to the method as set forth in claim 1.

12. A modulo hardware generation engine to generate a hardware design to calculate a modulo value for any integer input value in a target input range with respect to a constant divisor d, the hardware design comprising one or more range reduction stages, the engine comprising:
a plurality of range reduction modules, each range reduction module configured to generate a hardware design component to map an input range using one of a plurality of modulo preserving range reduction methods;
a synthesis module configured to generate one or more synthesis metrics for a hardware design component, the one or more synthesis metrics providing an indication of a quality of a synthesized version of the hardware design component;
decision logic in communication with the plurality of range reduction modules and the synthesis module, the decision logic configured to:
(a) generate at least one hardware design component to map a desired input range to a target output range using each of the plurality of range reduction modules;
(b) obtain one or more synthesis metrics for each of the hardware design components from the synthesis module;
(c) select one of the hardware design components as an optimum hardware design component for the desired input range based on the one or more synthesis metrics; and
(d) determining whether a maximum input range of the optimum hardware design component comprises the target input range;
(e) in response to determining that the maximum input range of the optimum hardware design component does not comprise the target input range, expanding the desired input range and repeating steps (a) to (d) for the expanded desired input range; and
(f) in response to determining that the maximum input range of the optimum hardware design component comprises the target input range, outputting the optimum hardware design component.

13. The engine of claim 12, wherein the desired input range is initially set to [0, d].

14. The engine of claim 12, wherein the decision logic is configured to expand the desired input range by setting the desired input range to the maximum input range of the optimum hardware design component and increasing the desired input range to include at least one additional number.

15. The engine of claim 12, wherein each hardware design component is associated with one of the plurality of range reduction modules and the decision logic is configured to generate a particular hardware design component by generating a primary hardware design component using the associated range reduction module.

16. The engine of claim 15, wherein the decision logic is further configured to generate the particular hardware design component by:
identifying an output range of the primary hardware design component;
determining whether the identified output range of the primary hardware design component is greater than the target output range; and
in response to determining that the identified output range of the primary hardware design component is greater than the target output range, combining the primary hardware design component with a previously identified optimum hardware design component to generate the particular hardware design component.

17. The engine of claim 12, wherein the one or more synthesis metrics comprise one or more of delay, area, and power usage to produce a modulo value.

18. The engine of claim 12, wherein the decision logic is further configured to receive selection criteria and select one of the hardware design components as the optimum hardware design component for the desired input range based on the one or more synthesis metrics and the selection criteria.

19. The engine of claim 12, wherein the hardware design comprises computer readable instructions that, when processed at an integrated circuit manufacturing system, cause the integrated circuit manufacturing system to generate a manifestation of an integrated circuit to calculate the modulo value.

20. A non-transitory computer readable storage medium having encoded thereon computer readable code to cause the following to be performed when the code is run on a computer:
  (a) generate at least one hardware design component to map a desired input range to a target output range using each of a plurality of modulo preserving range reduction methods for a constant divisor d;
  (b) synthesize each of the hardware design components;
  (c) select one of the hardware design components as an optimum hardware design component for the desired input range based on the synthesis;
  (d) determine whether a maximum input range of the optimum hardware design component comprises a target input range;
  (e) in response to determining that the maximum input range of the optimum hardware design component does not comprise the target input range, expanding the desired input range and repeating steps (a) to (d) for the expanded desired input range; and
  (f) in response to determining that the maximum input range of the optimum hardware design component comprises the target input range, outputting the optimum hardware design component as a hardware design to calculate a module value for any integer input value in the target input range with respect to the constant divisor d.

* * * * *